(12) United States Patent
Wu et al.

(10) Patent No.: US 11,410,897 B2
(45) Date of Patent: Aug. 9, 2022

(54) SEMICONDUCTOR STRUCTURE HAVING A DIELECTRIC LAYER EDGE COVERING CIRCUIT CARRIER

(71) Applicant: Taiwan Semiconductor Manufacturing Co., Ltd., Hsinchu (TW)

(72) Inventors: Chih-Wei Wu, Yilan County (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 90 days.

(21) Appl. No.: 16/454,099

(22) Filed: Jun. 27, 2019

(65) Prior Publication Data
US 2020/0411399 A1     Dec. 31, 2020

(51) Int. Cl.
*H01L 23/31*     (2006.01)
*H01L 23/49*     (2006.01)
(Continued)

(52) U.S. Cl.
CPC .......... *H01L 23/28* (2013.01); *H01L 23/5386* (2013.01); *H01L 24/94* (2013.01); *H01L 23/49827* (2013.01); *H01L 23/5384* (2013.01); *H01L 2224/1624* (2013.01); *H01L 2224/16157* (2013.01); *H01L 2224/16165* (2013.01); 
(Continued)

(58) Field of Classification Search
CPC ............. H01L 23/5382; H01L 23/3157; H01L 23/473; H01L 23/5383; H01L 23/5386; H01L 23/49827; H01L 23/5384; H01L 2224/16165; H01L 2224/16168; H01L 2224/16157; H01L 2224/16227; H01L 2224/16235; H01L 2224/16238; H01L 23/1624; H01L 2924/15151; H01L 2924/15331; H01L 2224/29006; H01L 2224/29008; H01L 2224/29009; H01L 2224/29011; H01L 2224/29078; H01L 2224/28105
See application file for complete search history.

(56) References Cited

U.S. PATENT DOCUMENTS 4,445,274 A * 5/1984 Suzuki ................ H01L 21/4867
                                                                29/832
5,699,027 A * 12/1997 Tsuji .................... H03H 9/0547
                                                                310/313 R
(Continued)

*Primary Examiner* — Ida M Soward
(74) *Attorney, Agent, or Firm* — JCIPRNET

(57) ABSTRACT

A semiconductor structure includes a circuit carrier, a dielectric layer, a conductive terminal, a semiconductor die, and an insulating encapsulation. The circuit carrier includes a first surface and a second surface opposite to each other, a sidewall connected to the first and second surfaces, and an edge between the second surface and the sidewall. The dielectric layer is disposed on the second surface of the circuit carrier and extends to at least cover the edge of the circuit carrier. The conductive terminal is disposed on and partially embedded in the dielectric layer to be connected to the circuit carrier. The semiconductor die encapsulated by the insulating encapsulation is disposed on the first surface of the circuit carrier and electrically coupled to the conductive terminal through the circuit carrier.

20 Claims, 25 Drawing Sheets

(51) Int. Cl.
*H01L 23/28* (2006.01)
*H01L 23/00* (2006.01)
*H01L 23/538* (2006.01)
H01L 23/498 (2006.01)

(52) U.S. Cl.
CPC ............ *H01L 2224/16168* (2013.01); *H01L 2224/16227* (2013.01); *H01L 2224/16235* (2013.01); *H01L 2224/16238* (2013.01); *H01L 2224/28105* (2013.01); *H01L 2224/29006* (2013.01); *H01L 2224/29008* (2013.01); *H01L 2224/29009* (2013.01); *H01L 2224/29011* (2013.01); *H01L 2224/29078* (2013.01); *H01L 2924/15151* (2013.01); *H01L 2924/15331* (2013.01)

(56) References Cited

U.S. PATENT DOCUMENTS

| | | | |
|---|---|---|---|
| 5,796,165 A * | 8/1998 | Yoshikawa | H01L 23/053 257/728 |
| 6,529,027 B1 * | 3/2003 | Akram | G01R 1/0408 324/750.16 |
| 7,838,976 B2 * | 11/2010 | Yamazaki | H01L 23/49855 257/684 |
| 7,880,296 B2 * | 2/2011 | Wong | H01L 24/19 257/700 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,686,866 B2 * | 6/2017 | Chang | H05K 1/0333 |
| 9,831,170 B2 * | 11/2017 | Scanlan | H01L 21/561 |
| 9,859,057 B2 * | 1/2018 | Ning | H05K 3/3447 |
| 10,185,862 B2 * | 1/2019 | Kim | G06K 9/0002 |
| 10,319,708 B2 * | 6/2019 | Pagani | H01L 24/20 |
| 10,515,921 B2 * | 12/2019 | Yu | H01L 21/6835 |
| 10,622,291 B2 * | 4/2020 | Haba | H01L 25/16 |
| 11,114,311 B2 * | 9/2021 | Tsai | H01L 24/17 |
| 11,145,623 B2 * | 10/2021 | Hsu | H01L 24/08 |
| 2006/0087029 A1 * | 4/2006 | Imanaka | H01L 23/5227 257/723 |
| 2016/0240466 A1 * | 8/2016 | Chen | H01L 23/565 |
| 2017/0011993 A1 * | 1/2017 | Zhao | H01L 23/49838 |
| 2018/0122791 A1 * | 5/2018 | Liu | H01L 23/5389 |
| 2018/0204802 A1 * | 7/2018 | Lin | H01L 23/5386 |
| 2019/0088552 A1 * | 3/2019 | Yu | H01L 23/49827 |
| 2020/0006178 A1 * | 1/2020 | Huang | H01L 21/78 |
| 2020/0027837 A1 * | 1/2020 | Jeng | H01L 23/5389 |
| 2020/0203287 A1 * | 6/2020 | Krefft | H01L 23/49822 |
| 2020/0294912 A1 * | 9/2020 | Tai | H01L 23/3731 |
| 2020/0395280 A1 * | 12/2020 | Chen | H01L 24/73 |
| 2021/0225746 A1 * | 7/2021 | Appelt | H01L 21/481 |

* cited by examiner

SEMICONDUCTOR STRUCTURE HAVING A DIELECTRIC LAYER EDGE COVERING CIRCUIT CARRIER

BACKGROUND

Semiconductor devices are used in a variety of electronic applications, such as personal computers, cell phones, digital cameras, and other electronic devices. As the demand for shrinking electronic devices has grown, a need for smaller and more creative packaging techniques of semiconductor dies has emerged. Thus, packages such as wafer level packaging (WLP) have begun to be developed. A common requirement for an advanced electronic circuit is the use of multiple integrated circuit devices (e.g., semiconductor dies) integrated in a single packaged structure. As such, the configuration of a three-dimensional (3D) package is developed. In another example, chip on substrate (CoS) or chip-on-wafer-on-substrate (CoWoS) technique is developed. As the amount and complexity of the integrated circuit devices mounted in a semiconductor package increase, the multi-chip package can achieve the configuration of a system on a chip (SoC). These new integration types for semiconductor structures face challenges relative to performance and reliability issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
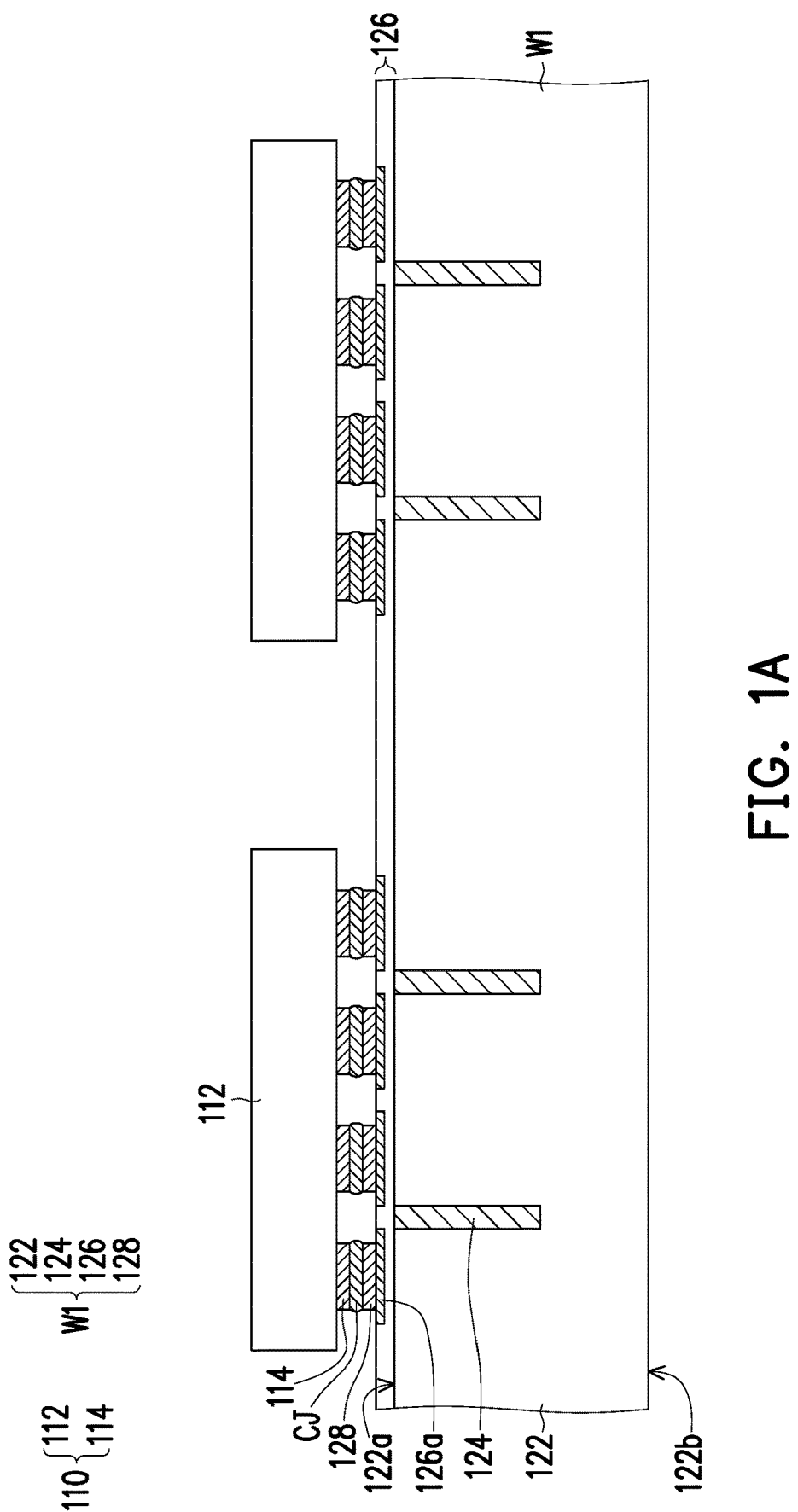
FIG. 1A to FIG. 1H are schematic cross-sectional views of various stages of manufacturing a semiconductor structure in accordance with some exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views of various stages of manufacturing a semiconductor structure in accordance with some exemplary embodiments of the disclosure. Referring to FIG. 1A, a plurality of semiconductor dies 110 are disposed on a circuit substrate W1. For example, the semiconductor dies 110 are formed in a device wafer (not shown), which may include different device regions that are singulated in subsequent steps to form a plurality of semiconductor dies 110. After performing a singulation process to separate individual semiconductor dies 110 from the device wafer, the semiconductor dies 110 are bonded to the circuit substrate W1 through flip-chip (face-to-face) bonding. The aforementioned process may be referred to as a chip-on-wafer process.

In some embodiments, the semiconductor die 110 includes a semiconductor substrate 112 and a plurality of die connectors 114 distributed on the semiconductor substrate 112. In some embodiments, the semiconductor substrate 112 includes an elementary semiconductor (e.g., silicon or germanium in a crystalline, a polycrystalline, or an amorphous structure, etc.), a compound semiconductor (e.g., silicon carbide, gallium arsenide, gallium phosphide, indium phosphide, indium arsenide, and/or indium antimonide, etc.), an alloy semiconductor (e.g., silicon-germanium (SiGe), gallium arsenide phosphide (GaAsP), aluminum indium arsenide (AlInAs), aluminium gallium arsenide (AlGaAs), gallium indium arsenide (GaInAs), gallium indium phosphide (GaInP), etc.), combinations thereof, or other suitable materials. For example, the compound semiconductor substrate may have a multilayer structure, or the substrate may include a multilayer compound semiconductor structure. In some embodiments, the alloy SiGe is formed over a silicon substrate. In other embodiments, a SiGe substrate is strained. For example, the semiconductor substrate 112 includes a plurality of semiconductor devices, such as active devices (e.g., transistors, diodes, etc.) and/or passive devices (e.g., capacitors, resistors, inductors, etc.), or other suitable electrical components, formed therein. The semiconductor substrate 112 may include circuitry (not shown) formed in a front-end-of-line (FEOL), and an interconnect structure (not shown) formed in a back-end-of-line (BEOL).

In some embodiments, the surface where the die connectors 114 are distributed may be referred to as the active surface of the semiconductor die 110. For example, the die connectors 114 are metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the die connectors 114 are micro bumps made of copper, nickel, tin, gold, silver, palladium, metal alloy, the like, or a combination thereof. In some embodiments, the die connectors 114 are solder free and have substantially vertical sidewalls.

The semiconductor die 110 may be or may include a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. It should be appreciated that the number of the semiconductor dies and the functions of the semiconductor dies to be encapsulated may depend on the design requirements.

Continue to FIG. 1A, the circuit substrate W1 includes a substrate 122 having a first surface 122a and a second surface 122b opposite to each other, a plurality of conductive vias 124 embedded in the substrate 122 and extending from the first surface 122a towards the second surface 122b, a circuit layer 126 formed on the first surface 122a of the substrate 122 and electrically coupled to the conductive vias 124, and a plurality of conductive connectors 128 disposed on the circuit layer 126 to be in contact with external components (e.g., the semiconductor dies 110). For example, the substrate 122 is made of silicon or other suitable materials such as ceramic, glass, plastic, resin or epoxy. In some embodiments in which the substrate 122 is made of silicon, the conductive vias 124 are formed by forming recesses (not shown) in the substrate 122 and depositing dielectric liner (not shown), barrier materials (not shown), and conductive materials in the recesses of the substrate 122, removing excess materials on the substrate 122. For example, the recesses of the substrate 122 are lined with the dielectric liner to laterally separate the conductive vias 124 from the substrate 122.

The conductive vias 124 may be formed by using a via-first approach, and may be formed during the formation of the circuit layer 126. Alternatively, the conductive vias 124 are formed by using a via-last approach, and may be formed after the formation of circuit layer 126. In some embodiments, the circuit layer 126 includes circuit patterns (not shown) embedded in a dielectric layer formed in a back-end-of-line (BEOL), and a plurality of conductive pads 126a electrically coupled to the circuit patterns. A material of the conductive pads 126a may include aluminum, but other suitable conductive materials (e.g., copper) may be used. The conductive connectors 128 may land on the conductive pads 126a of the circuit layer 126, and the conductive connectors 128 are electrically coupled to the conductive vias 124 through the circuit layer 126. In some embodiments, the circuit substrate W1 is a wafer, and the processes are performed at a die-to-wafer level. Alternatively, the process may be performed at the die-to-die level.

Still referring to FIG. 1A, in some embodiments, the semiconductor dies 110 are coupled to the circuit substrate W1 by cap layers. For example, the semiconductor dies 110 includes a cap layer (not shown) formed on the die connectors 114 and facing towards the circuit substrate W1, and the circuit substrate W1 may include a cap layer (not shown) formed on the conductive connectors 128 and facing towards the semiconductor dies 110. Alternatively, the cap layer of the semiconductor dies 110 or the cap layer of the circuit substrate W1 is omitted. In some embodiments, the cap layers are formed by initially forming a layer of solder through methods such as evaporation, electroplating, printing, solder transfer, ball placement, or the like. For example, once the semiconductor dies 110 have been disposed on the circuit substrate W1, a reflow process is performed to cause the cap layers to be melted to form conductive joints CJ between each semiconductor die 110 and the circuit substrate W1. The conductive joints CJ provide attachment and electrical connections between the semiconductor die 110 and the circuit substrate W1.

Figure 1B:
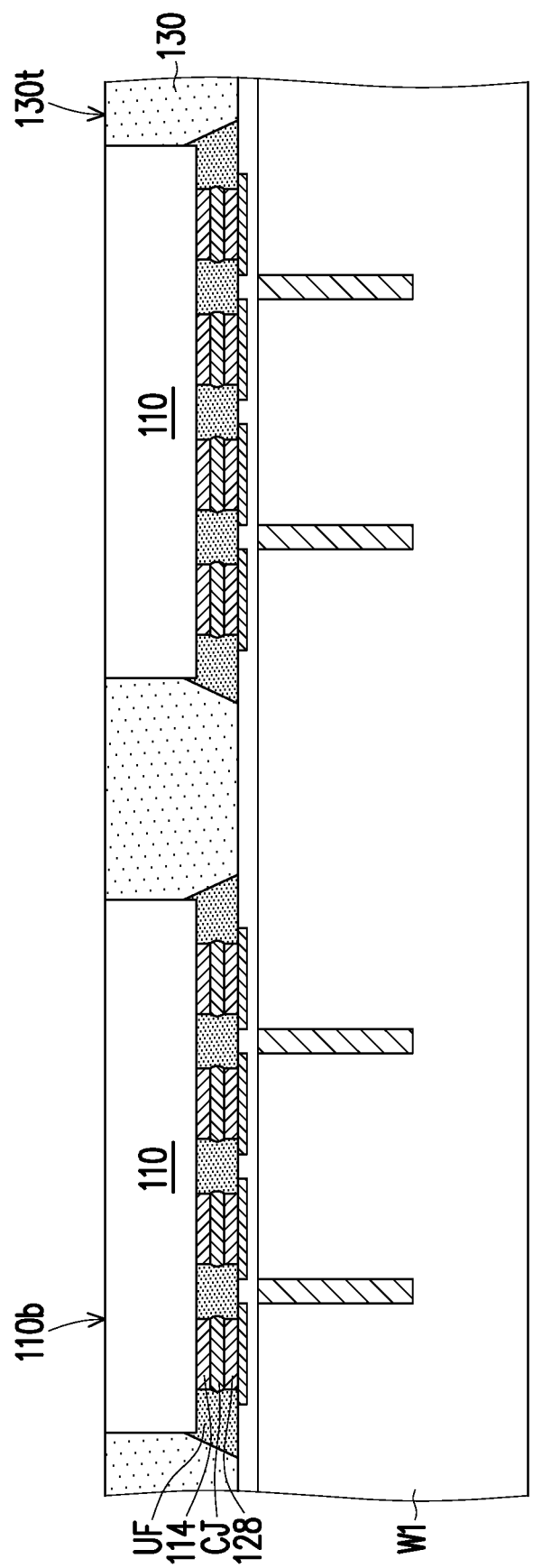

Referring to FIG. 1B, an insulating encapsulation 130 is formed on the circuit substrate W1 to encapsulate the semiconductor dies 110. The insulating encapsulation 130 is rigid enough to protect the semiconductor dies 110. A material of the insulating encapsulation 130 may include epoxy resin, molding compound, molding underfill, or other suitable electrical insulating materials. For example, the insulating encapsulation 130 is formed by compression molding, transfer molding, or the like. After forming the insulating encapsulation 130, each semiconductor die 110 is surrounded by the insulating encapsulation 130, and two adjacent semiconductor dies 110 may be spatially separated by the insulating encapsulation 130. In some embodiments, a thinning process (e.g., mechanical grinding, chemical mechanical polishing (CMP), etching, or the like) is performed to thin the insulating encapsulation 130. For example, the insulating encapsulation 130 is thinned until back surfaces 110b of the semiconductor dies 110 are exposed, thereby reducing the overall thickness of the structure. In other embodiments, the back surfaces 110b of the semiconductor dies 110 may be slightly thinned along with the insulating encapsulation 130 during the thinning process. For example, the back surfaces 110b of the semiconductor dies 110 and the top surface 130t of the insulating encapsulation 130 are substantially leveled. Alternatively, the thinning process is omitted, and the back surfaces 110b of the semiconductor dies 110 are covered by the insulating encapsulation 130.

Continue to FIG. 1B, in some embodiments, before forming the insulating encapsulation 130, an underfill layer UF is formed between the semiconductor dies 110 and the circuit substrate W1. The die connectors 114, the conductive joints CJ, and the conductive connectors 128 may be surrounded by the underfill layer UF. For example, the underfill material is dispensed and drawn into the gaps between the active surfaces of the semiconductor dies 110 and the circuit substrate W1 by capillary action, and then the underfill material may be cured to form the underfill layer UF. In some embodiments, when a sufficient amount of the underfill material is dispensed, a portion of the underfill layer UF may climb up to cover the sidewalls of the semiconductor dies 110 to provide a degree of protection. The underfill layer UF may improve the adhesion between semiconductor dies 110 and the circuit substrate W1 and may provide a stress relief to prevent the conductive joints CJ from cracking. Alternatively, the underfill layer UF is omitted. In such embodiments, the insulating encapsulation 130 may be formed in the gaps between the active surfaces of the semiconductor dies 110 and the circuit substrate W1.

Figure 1C:
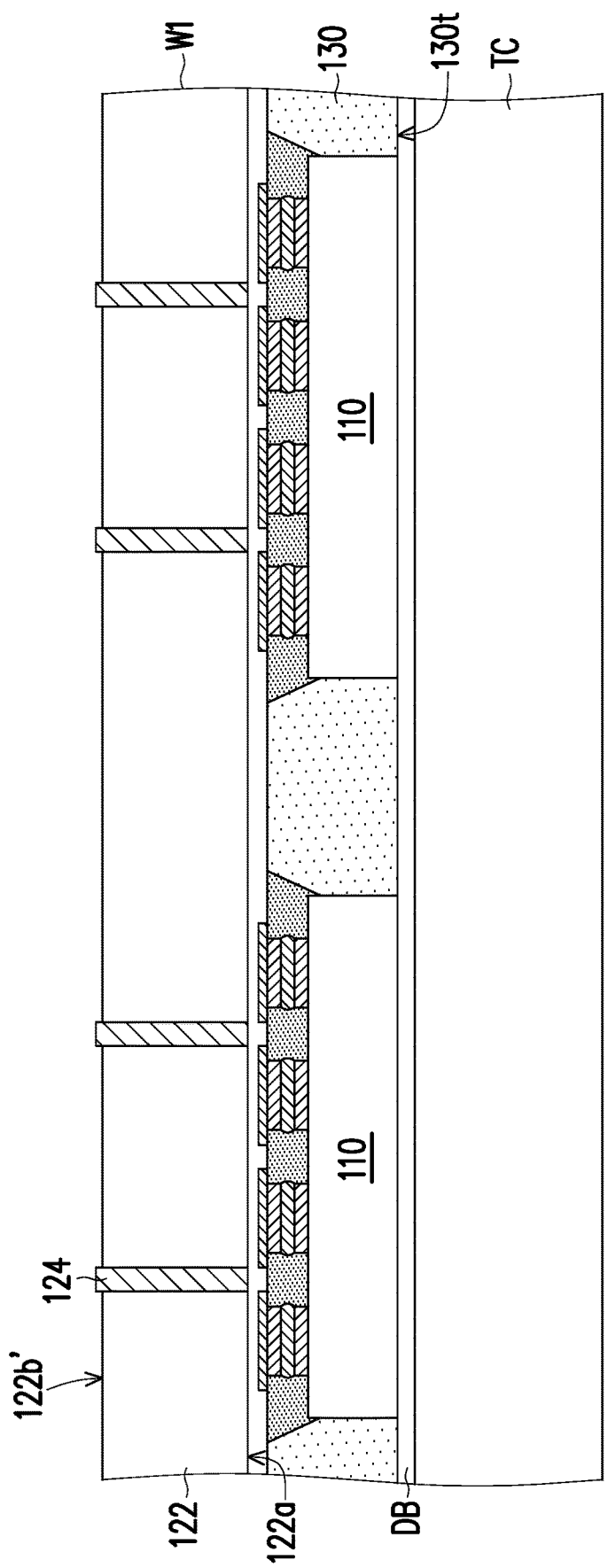

Referring to FIG. 1C, a thinning process (e.g., mechanical grinding, chemical mechanical polishing (CMP), etching, and/or a combination thereof) is performed on the second surface 122b of the substrate 122 of the circuit substrate W1 to expose the conductive vias 124. In some embodiments, to perform the thinning process on the second surface 122b of the substrate 122, the structure illustrated in FIG. 1B may be overturned (e.g., flipped upside down) and then disposed on a temporary carrier TC. A material of the temporary carrier TC may include glass, metal, ceramic, silicon, plastic, combinations thereof, multi-layers thereof, or other suitable material that can hold and support the structure during the following processes. For example, the top surface 130t of the insulating encapsulation 130 is attached to the temporary carrier TC through a de-bonding layer DB. The de-bonding layer DB may include a polymer adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used. Alternatively, the de-bonding layer DB is omitted.

In an exemplary embodiment, the thinning process includes at least the following steps. A planarizing process (e.g., grinding or CMP) may be performed to initially expose the conductive vias 124. Subsequently, a wet or dry etching process having a high etch-rate selectivity between the material of the dielectric liners and the material of the substrate 122 may be performed to recess the substrate 122 so as to leave at least the conductive vias 124 protruding from the thinned second surface 122b' of the substrate 122. In an embodiment, the conductive vias 124 are protruded about a few microns from the thinned second surface 122b' of the substrate 122. In some embodiments, the conductive vias 124 penetrating through the substrate 122 are referred to as through interposer vias (TIV) if the circuit substrate W1 is diced (as shown in FIG. 1E and FIG. 1H).

Figure 1D:
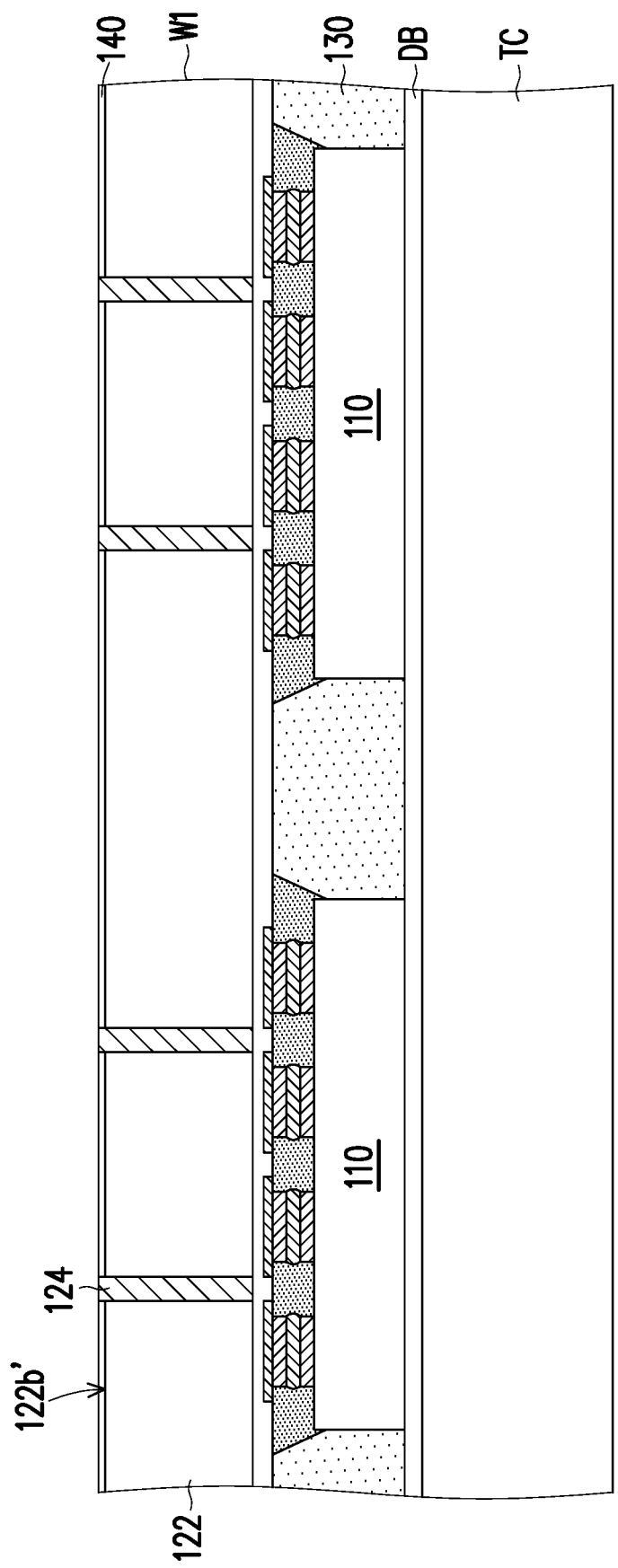

Referring to FIG. 1D, an isolation layer 140 is formed on the substrate 122 to at least laterally cover the conductive vias 124. For example, the isolation layer 140 is a dielectric material, such as SiN, an oxide, SiC, SiON, a polymer, or the like. The isolation layer 140 may be formed by spin-coating, printing, a chemical vapor deposition (CVD), or other suitable deposition process. In some embodiments, the dielectric material with a sufficient thickness is formed on the thinned second surface 122b' of the substrate 122 and covers the conductive vias 124 protruded from the thinned second surface 122b', and then the thinning process (e.g., mechanical grinding, CMP, etching, and/or a combination thereof) is performed on the dielectric material to form the isolation layer 140 and leave the conductive vias 124 accessibly revealing from the isolation layer 140. In some embodiments, the top surface of the isolation layer 140 is substantially leveled with the top surfaces of the conductive vias 124. In other embodiments, the conductive vias 124 are slightly protruded from the top surface of the isolation layer 140.

Figure 1E:
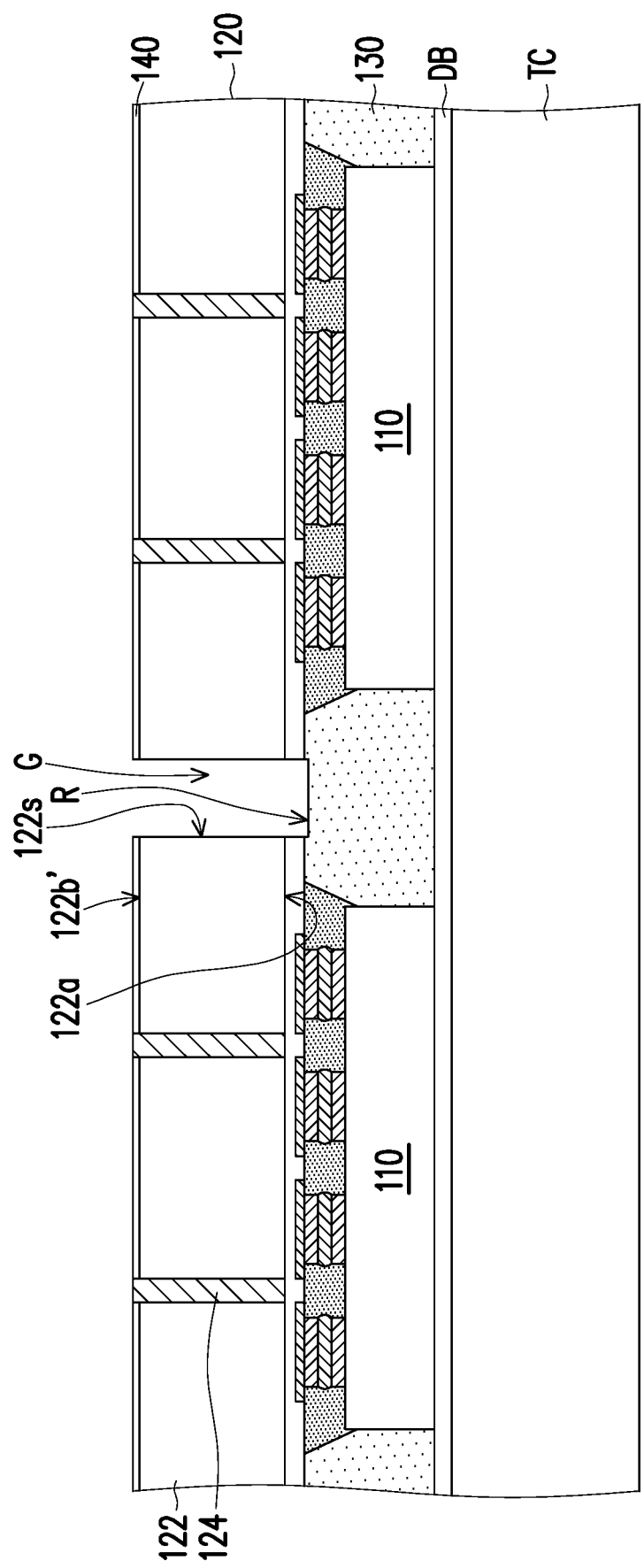

Referring to FIG. 1E, a singulation process is performed on the circuit substrate W1 to dice the circuit substrate W1 into a plurality of circuit carriers 120 according to the predetermined areas (not shown). The predetermined areas may be separated by scribe line regions (i.e. non-functional regions; not shown). For example, the circuit substrate W1 is singulated along scribe lines (not shown) within the scribe line regions by using laser cutting, dicing blade, etching, a combination thereof, or the like. In some embodiments, the singulation process includes cutting through the circuit substrate W1 such that a gap G is formed between two adjacent circuit carriers 120. In some embodiments, the singulation process performing on the circuit substrate W1 is regarded as a pre-cutting process. The pre-cutting process may be performed to completely cut through the circuit substrate W1. In some embodiments, to ensure the circuit substrate W1 is completely cut through, a portion of the insulating encapsulation 130 is removed along with the circuit substrate W1 in the pre-cutting process. In such embodiments, a recess R is formed on the insulating encapsulation 130 corresponding to the gap G. In some embodiments, in a top-down view (not shown), a plurality of trenches (i.e. gaps G) are formed surrounding the predetermined areas in a grid pattern, which may include a group of mutually parallel trenches arranged perpendicular to another group of trenches.

In other embodiments, the pre-cutting process is to partially cut the circuit substrate W1. For example, the circuit substrate W1 is not completely diced through and a groove is formed on the circuit substrate W1 at this stage, so that the insulating encapsulation 130 is not recessed but covered by the circuit substrate W1. The details of such embodiments will be described later in accompanying with figures. In some embodiments, the circuit carriers 120 are diced as rectangular shapes with sharp edges and corners. For example, the substrate 122 of the circuit carrier 120 has substantially vertical diced sidewalls 122s connected to the first surface 122a and the thinned second surface 122b'. In other embodiments in which the groove is formed on the circuit substrate in the pre-cutting process, the circuit carrier includes bevel cuts on edges.

Figure 1F:
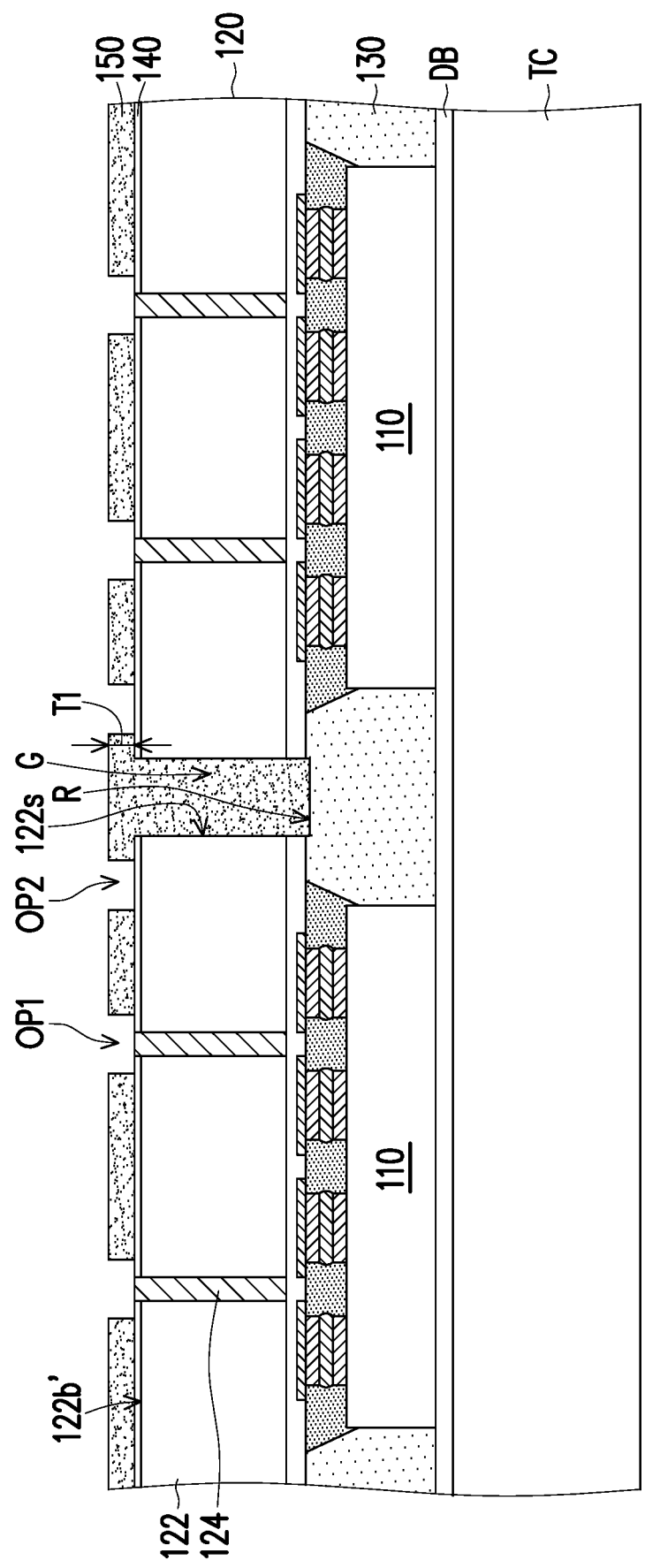

Referring to FIG. 1F, a patterned dielectric layer 150 is formed over the circuit carriers 120 and wraps the edges and corners of the circuit carriers 120. For example, a dielectric material is formed over the circuit carriers 120 and extends along the sidewalls 122s of the circuit carrier 120 by spin-coating, chemical vapor deposition (CVD), physical vapor deposition (PVD), or the like. The isolation layer 140 is interposed between the dielectric material and the substrate 122. Subsequently, a portion of the dielectric material is removed to form the patterned dielectric layer 150 by lithography (i.e. exposure and development) and etching processes, a laser drilling process, or other suitable removal techniques. The dielectric material may be different from the material of the underlying isolation layer 140, so that after performing the removal process, the isolation layer 140 is not removed and may remain on the thinned second surface 122b' of the substrate 122.

In some embodiments, the patterned dielectric layer 150 includes a thickness T1 that allows the patterned dielectric layer 150 to act as a buffer for lessening stress on the circuit carriers 120. The patterned dielectric layer 150 may be a multi-layered structure. For example, the average thickness of the patterned dielectric layer 150 over the circuit carrier 120 ranges from about 2 μm to about 50 μm. In some embodiments, a material of the patterned dielectric layer 150 is relatively soft to cushion forces exerted on the corners and edges of the circuit carriers 120. For example, the patterned dielectric layer 150 has a Young's modulus smaller than that of the insulating encapsulation 130. The Young's modulus of the patterned dielectric layer 150 may be in a range from about 0.5 GPa to about 10 GPa. The patterned dielectric layer 150 may be made of polyimide (PI), benzocyclobutene (BCB), polybenzoxazole (PBO), photosensitive polyimide material, soft organic materials, combinations thereof, or other electrical insulating materials.

In some embodiments in which the insulating encapsulation 130 is recessed, the patterned dielectric layer 150 coves the edges and corners of the circuit carriers 120 and extends along the sidewalls 122s to fill the gap G and the recess R, so that the patterned dielectric layer 150 may be in physical contact with the insulating encapsulation 130. In some embodiments, the patterned dielectric layer 150 includes a plurality of first openings OP1 accessibly revealing at least a portion of the TIVs (i.e. conductive vias) 124 for further electrical connection. In some embodiments, the width (or diameter) of the first opening OP1 is greater than the width of the corresponding TIV 124 for better reliability and manufacturability. It should be noted that the width of the first opening OP1 construe no limitation in the disclosure as long as the TIVs 124 may be accessibly revealed for further electrical connection. In some embodiments, the patterned dielectric layer 150 further includes at least one second opening OP2 formed aside the gap G or formed at the periphery of the predetermined area. For example, the second opening OP2 serves as an alignment mark for the subsequently process (e.g., singulation). Alternatively, the second opening OP2 is omitted.

Figure 1G:
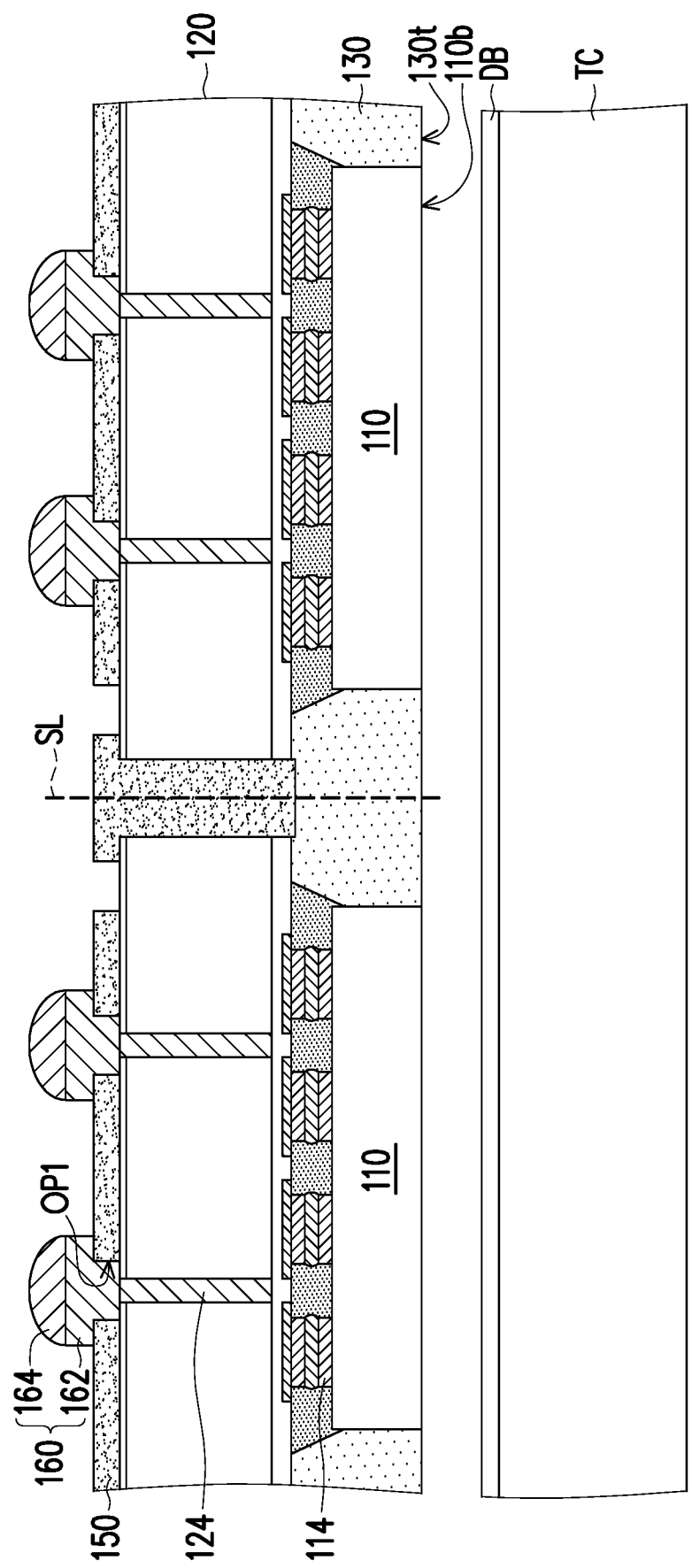
Figure 1H:
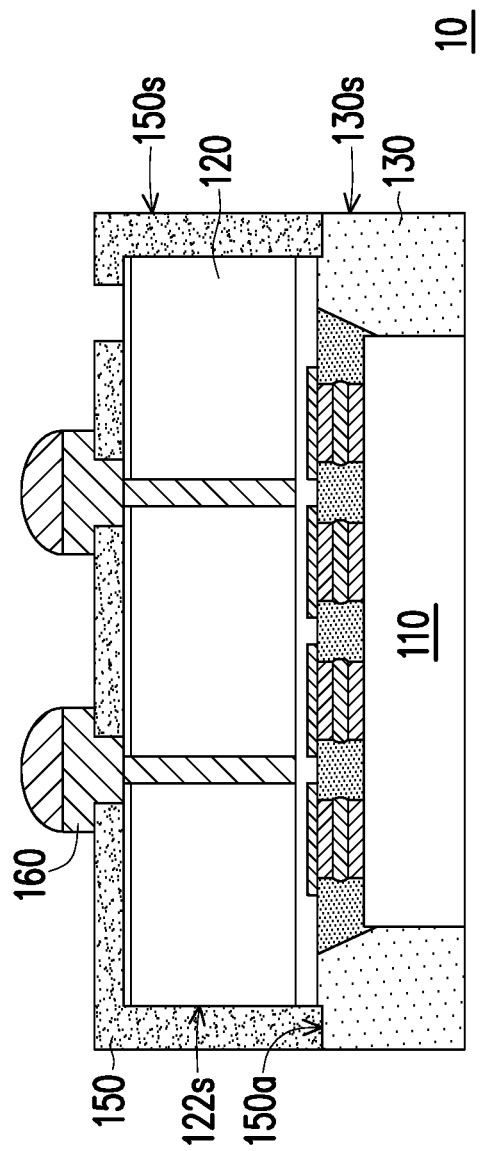

Referring to FIG. 1G, a plurality of conductive terminals 160 is formed on the patterned dielectric layer 150 and inside the first openings OP1 of the patterned dielectric layer 150 to be in physical and electrical contact with the TIVs 124 of the circuit carriers 120. The conductive terminals 160 are electrically coupled to the semiconductor dies 110 through the circuit carriers 120. In some embodiments, the conductive terminal 160 includes a first portion 162 and a second portion 164 disposed on the first portion 162. For example, conductive materials are deposited on the patterned dielectric layer 150 and inside the first openings OP1 of the patterned dielectric layer 150 and patterned to form the first portions 162 of the conductive terminals 160. The first portions 162 may include conductive vias formed in the first openings OP1, conductive pads formed on the conductive vias, under bump metallization (UBM) patterns formed on the conductive pads, etc. The UBM patterns (not shown) may provide additional adhesion to the conductive pads and increase solderability. Alternatively, the UBM patterns are omitted by directly soldering on the conductive pads.

The second portions 164 of the conductive terminals 160 are formed on the first portions 162 by, for example, using ball mounting, screen printing, electroless or electroplating, controlled collapse chip connection (C4) plating, or other suitable techniques. The conductive materials of the second portions 164 may include lead based material such as lead-tin compounds or lead free eutectics including tin, copper, silver, nickel, gold, and other lead free materials. In some embodiments, after the second portions 164 are formed on the first portions 162, a reflow process is performed to reshape the second portions 164, and each of the second portions 164 are limited by one of the first portions 162. In some embodiments, the dimensions and pitches of the conductive terminals 160 are larger than those of the die connectors 114 of the semiconductor dies 110 since the scale of the semiconductor die 110 is smaller than the following external electrical component (shown in FIG. 3). In some embodiments, the conductive terminals 160 are referred to as refers to ball grid array (BGA) or controlled collapse chip connection (C4) bumps.

Continue to FIG. 1G, a de-bonding process may be performed on the temporary carrier TC to release the temporary carrier TC from the insulating encapsulation 130 after forming the conductive terminals 160. For example, external energy (e.g., UV light or a laser) is applied on the de-bonding layer DB. Alternatively, the removal process of the temporary carrier TC may include a mechanical peel-off process, a grinding process, an etching process, or the like. A cleaning process is optionally performed to remove residues of the de-bonding layer DB from the top surface 130t of the insulating encapsulation 130 (along with the back surfaces 110b of the semiconductor dies 110, in some embodiments). The cleaning process may be performed by using suitable solvent, cleaning chemical, or other cleaning techniques.

Referring to FIG. 1G and FIG. 1H, a singulation process may be performed to cut through the patterned dielectric layer 150 and the underlying insulating encapsulation 130 within the scribe line regions. For example, after removing the temporary carrier TC, the structure may be transferred to be placed on a dicing tape which may holds the structure in place during the singulation process. The singulation process includes cutting the predetermined areas that the pre-cutting process previously cut to separate the predetermined areas into a plurality of semiconductor structures 10. For example, a dicing tool (e.g., a saw blade or a laser cutting device) is used to cut through the patterned dielectric layer 150 in the gap G and the underlying insulating encapsulation 130 along the scribe lines SL. It should be noted that a single semiconductor die 110 illustrated in FIG. 1H merely serves as an illustrative example, more than one semiconductor die 110 may be encapsulated in the insulating encapsulation 130 to perform multi-functions, and the disclosure is not limited thereto.

As shown in FIG. 1H, after performing the singulation process, the patterned dielectric layer 150 formed over the circuit carrier 120 wraps the edges and corners of the circuit carrier 120 and extends to cover the sidewalls 122s of the circuit carrier 120. In some embodiments, the patterned dielectric layer 150 extends beyond the sidewalls 122s of the circuit carrier 120 to have a surface 150a contacting and interfacing with the insulating encapsulation 130. The surface 150a of the patterned dielectric layer 150 may be located between the top surface 130t of the insulating encapsulation 130 and the interface between the circuit carrier 120 and the insulating encapsulation 130. After performing the singulation process, the singulated sidewall 150s of the patterned dielectric layer 150 may be substantially leveled with the singulated sidewall 130s of the insulating encapsulation 130.

Figure 2:
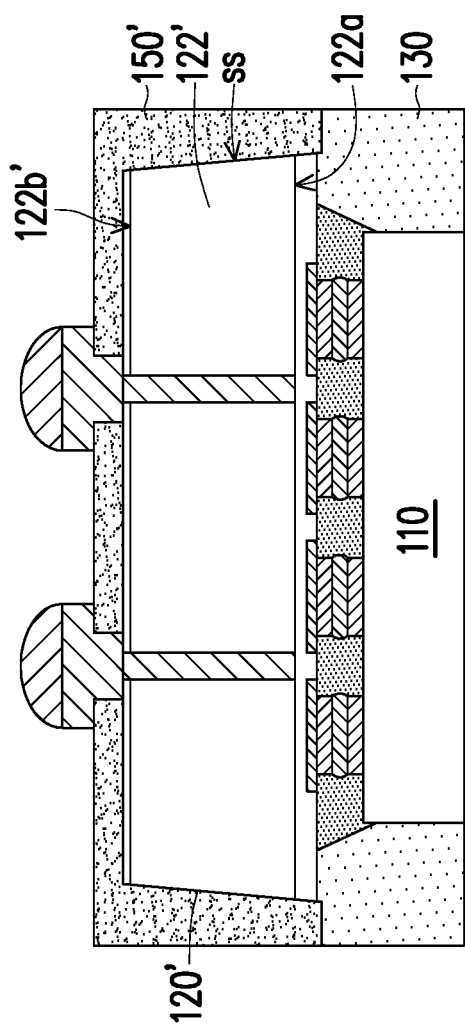
FIG. 2 is a schematic cross-sectional view illustrating a semiconductor structure in accordance with some exemplary embodiments of the disclosure.

FIG. 2 is a schematic cross-sectional view illustrating a semiconductor structure in accordance with some exemplary embodiments of the disclosure. Referring to FIG. 2, a semiconductor structure 15 is provided. The semiconductor structure 15 may be similar to the semiconductor structure 10 described in FIG. 1H, and like elements are designated with the same reference numbers for ease of understanding and the details thereof are not repeated herein. The difference between the semiconductor structures 10 and 15 includes the profiles of the circuit carrier 120' and the patterned dielectric layer 150'. For example, the substrate 122' of the circuit carrier 120' include a slanted sidewall SS connected to the thinned second surface 122b' and the first surface 122a. The surface area of the thinned second surface 122b' may be greater than the surface area of first surface 122a. The patterned dielectric layer 150' may cover the slanted sidewall SS. A portion of the patterned dielectric layer 150' formed on the top of the slanted sidewall SS (e.g., immediately adjacent to the thinned second surface 122b') may be thicker than another portion of the patterned dielectric layer 150' formed on the bottom of the slanted sidewall SS (e.g., immediately adjacent to the first surface 122a).

The forming process of the semiconductor structure 15 may be similar to the forming process of the semiconductor structure 10, except that the singulation process performing on the circuit substrate as described in FIG. 1E. After performing the singulation process on the circuit substrate to dice the circuit substrate into the circuit carriers 120', the beveled trench is formed between adjacent circuit carriers 120' by, for example, using the dicing blade with the corresponding shape to pass through the circuit substrate. For example, the profile of the beveled trench may be an inverted trapezoid shape in a cross-section. The circuit carriers 120' is formed with the slanted sidewalls SS which may correspond to the profile of the beveled trench. Next, the patterned dielectric layer 150' is formed over the circuit carriers 120', wherein the patterned dielectric layer 150' fills the beveled trench. Subsequently, the singulation is performed on the patterned dielectric layer 150' in the beveled trench and the underlying insulating encapsulation 130 to form the semiconductor structures 15. The forming process of the patterned dielectric layer 150' and the following singulation process may be similar to the processes described in FIG. 1F and FIG. 1G, so the detailed descriptions are omitted for brevity.

Figure 3:
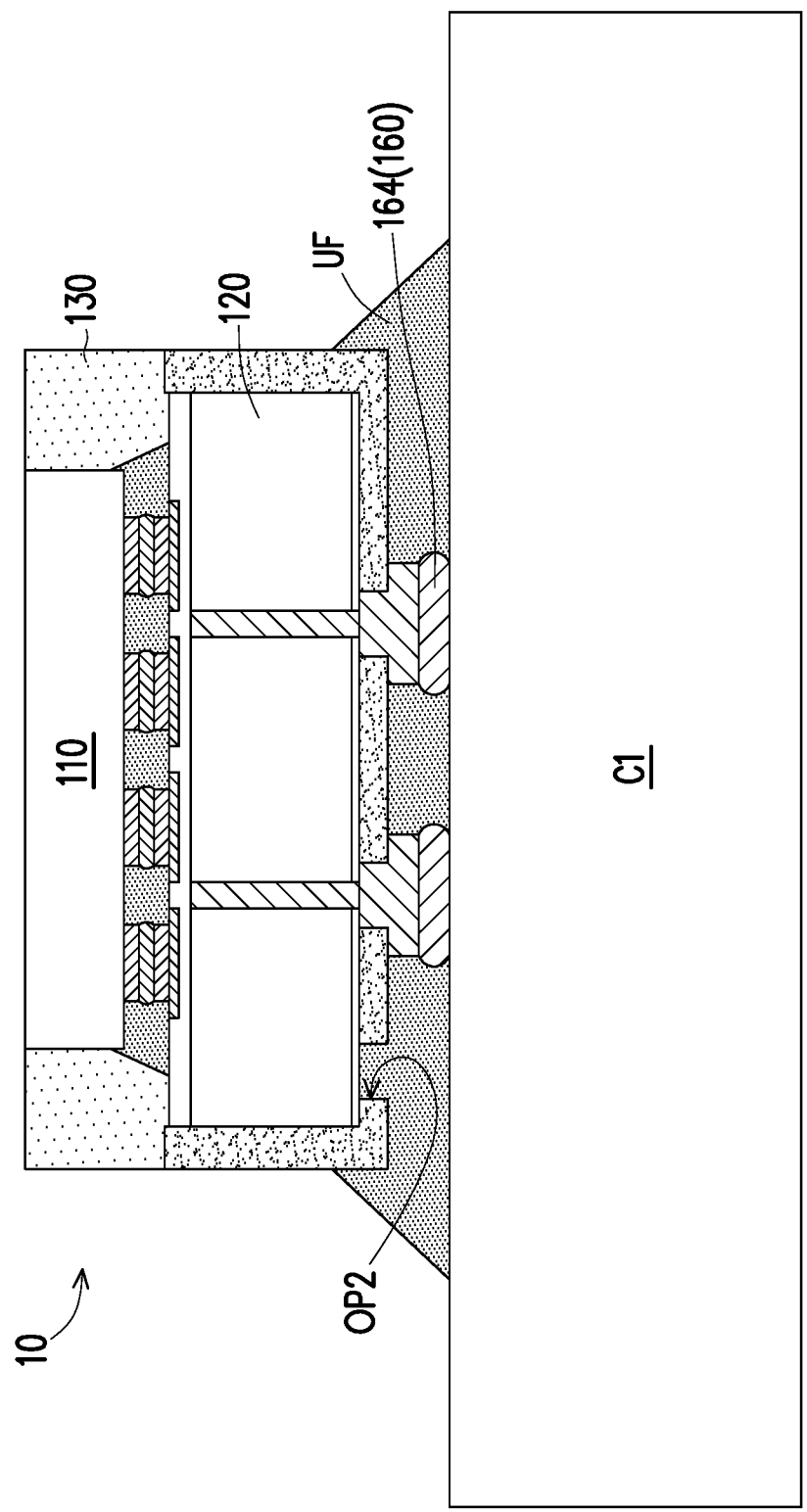
FIG. 3 is a schematic cross-sectional view illustrating an application of a semiconductor structure in accordance with some exemplary embodiments of the disclosure.

FIG. 3 is a schematic cross-sectional view illustrating an application of a semiconductor structure in accordance with some exemplary embodiments of the disclosure. Like elements are designated with the same reference numbers for ease of understanding and the details thereof are not repeated herein. Referring to FIG. 3, the semiconductor structure 10 is mounted on an external electric component C1 to form an electronic device ED1. The external electric component C1 may be or may include an a package substrate, a printed circuit board (PCB), a mother board, a system board, and/or other circuit board that is capable of carrying integrated circuits. For example, the semiconductor structure 10 is in physical and electrical contact with the external electric component C1 through the conductive terminals 160. In some embodiments, a reflow process is performed to complete the mechanical and electrical connection between the semiconductor structure 10 and the external electric component C1 by reflowing the second portions 164 of the conductive terminals 160.

In some embodiments, an underfill layer UF is formed between the semiconductor structure 10 and the external electric component C1 and surrounds the conductive terminals 160 to provide adhesion and stress relief therebetween. The circuit carrier 120 is separated from the underfill UF by the patterned dielectric layer 150. In certain embodiments in which the patterned dielectric layer 150 is provided with the second openings OP2, the underfill layer UF is formed in the gap between the patterned dielectric layer 150 and the external electric component C1 and extends into the second openings OP2 the patterned dielectric layer 150. After mounting the semiconductor structure 10 onto the external electric component C1, the semiconductor die 110 is able to receive and transmit signals from the external electric component C1 through the circuit carrier 120 and the conductive terminals 160. It should be noted that a single semiconductor structure 10 illustrated in FIG. 3 merely serves as an illustrative example, and the quantity and the type of the semiconductor structure is not limited to the illustrations.

For example, during the mounting process and/or the following reliability test, the stack of the semiconductor structure 10 and the external electric component C1 is heated and cooled down repeatedly in a thermal cycling and/or subjected to shearing and stress. The conductive terminals 160 and the underfill layer UF near the edges and corners of the circuit carrier 120 may suffer from serious stress. The patterned dielectric layer 150 formed on the edges and corners of the circuit carrier 120 may serve as a stress buffer to absorb and/or disperse the stress between the circuit carrier 120 and the external electric component C1. The occurrence of cracks in the underfill layer UF and/or in the circuit carrier 120, during the mounting process and/or the reliability test, may be prevented, and thus the conductive terminals 160 may provide a reliable electrical connection. In some embodiments, significant stress reduction (about 80%) exerted on the corners of the circuit carrier may be achieved by wrapping the corners of the circuit carrier with the patterned dielectric layer, compared with the structure without the patterned dielectric layer covering the corners of the circuit carrier.

Figure 4A:
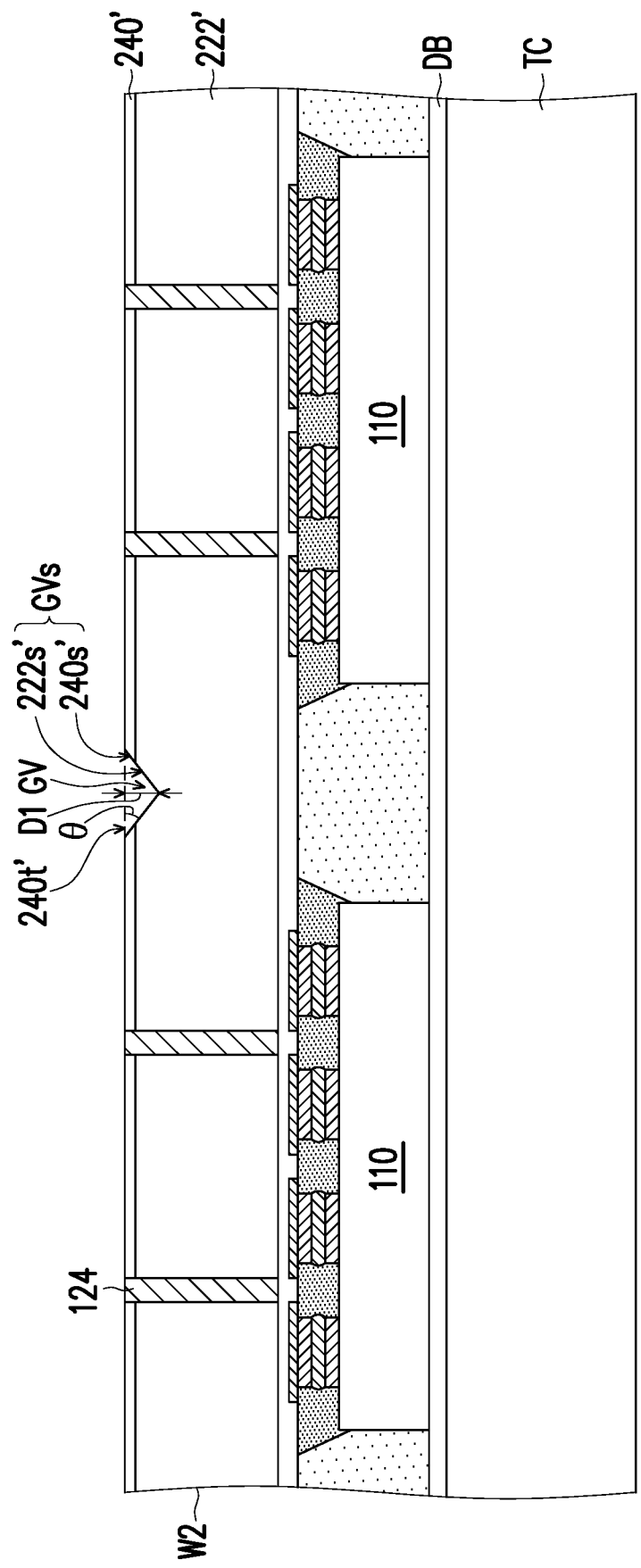
FIG. 4A to FIG. 4D are schematic cross-sectional views of various stages of manufacturing a semiconductor structure in accordance with some exemplary embodiments of the disclosure.

FIG. 4A to FIG. 4D are schematic cross-sectional views of various stages of manufacturing a semiconductor structure in accordance with some exemplary embodiments of the disclosure. Referring to FIG. 4A, a pre-cutting process is performed on the circuit substrate W1 (as shown in FIG. 1D) to form a pre-cut circuit substrate W2. The processes prior to the pre-cutting may be similar to the processes described in FIG. 1A to FIG. 1D, so the detailed descriptions are omitted for brevity. Like elements are designated with the same reference numbers for ease of understanding and the details thereof are not repeated herein.

The pre-cutting process may include bevel cutting, laser cutting, blade sawing, or the like. In some embodiments, the pre-cutting process is to partially cut the circuit substrate W1 (as shown in FIG. 1D) to form a groove GV thereon. The pre-cutting process does not penetrate the circuit substrate W1. For example, the pre-cutting process may partially remove materials within the scribe line regions, including the isolation layer 140 and the underlying substrate 122 (as shown in FIG. 1D), to result in the groove GV. Since a portion of the substrate is removed along with a portion of the overlying isolation layer, the sidewalls 240s' of the pre-diced isolation layer 240' and the sidewalls 222s' of the pre-diced substrate 222' are continuously formed as sidewalls GVs of the groove GV.

The shape of the groove GV may be defined by the shape of the dicing tool. For example, the dicing tool has a cross-section of a rectangular shape, a triangular shape, a round shape, a polygon shape, a polygon shape with chamfered or beveled endpoint, or the like. In some embodiments, the groove GV is a bevel cut formed by using a V-shaped dicing blade. Alternatively, a beveled groove may be chemically formed along the predetermined area. For example, the opposing sidewalls GVs of the groove GV are slanted towards each other. In some embodiments, the groove GV reaches a depth D1 of the pre-cut circuit substrate W2. The depth D1 may be in a range from about 10 μm to about 150 μm. In some embodiments, the sidewall 222s' of the pre-diced substrate 222' has an angle θ between approximately 5 and 90 degrees relative to the reference plane 240t' which is extended from the top surface of the pre-diced isolation layer 240'. In other embodiments, the groove GV has a curved profile in a cross section. In another embodiment, the V-shaped dicing blade cuts deeper in the pre-cut circuit substrate W2 to render the groove GV having a V-shaped bottom connected to a vertical sidewall. Alternatively, the groove GV may have a substantially flat bottom connected to a slanted sidewall by using a different dicing blade. It should be noted that FIG. 4A is merely serves as an illustrative example, the shape and the depth of the groove GV construe no limitation in the disclosure. In some embodiments, a plurality of grooves GV are formed in a grid pattern in a top-down view (not shown), which may include a group of mutually parallel grooves arranged perpendicular to another group of grooves.

Figure 4B:
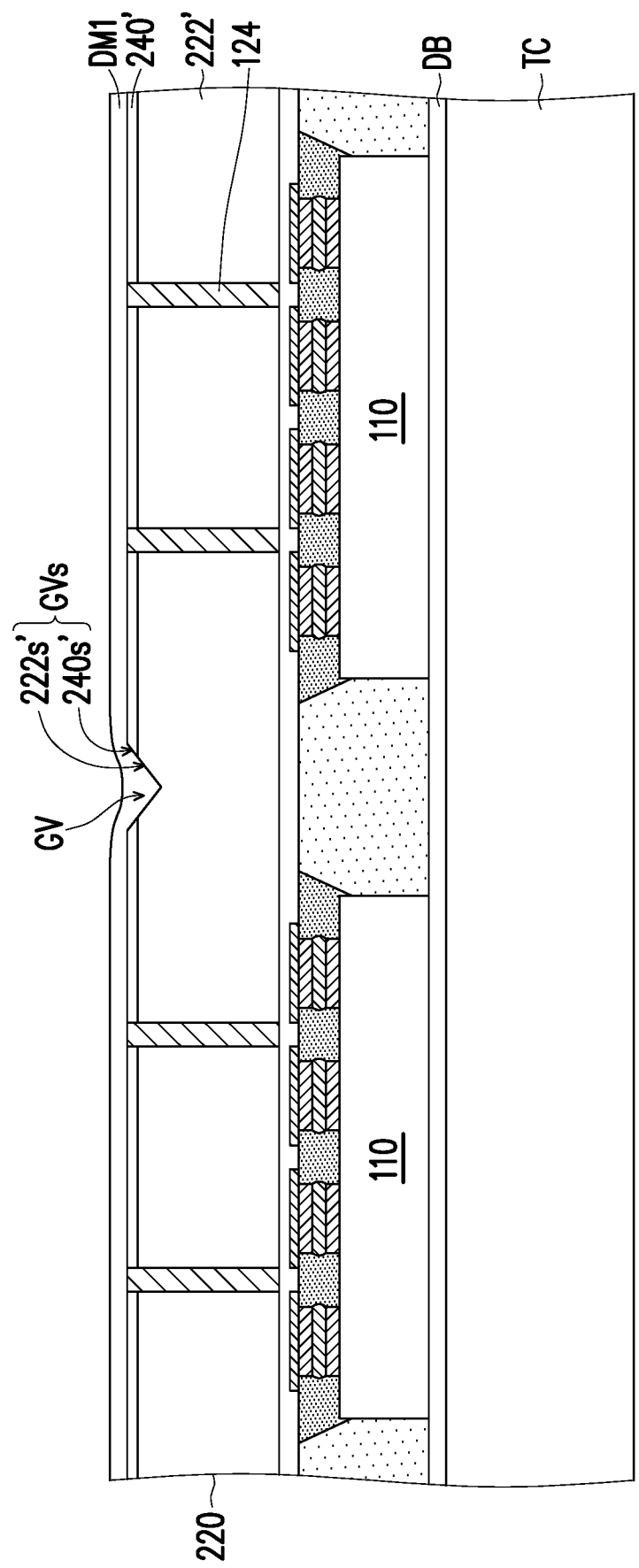

Referring to FIG. 4B, a first dielectric sub-layer DM1 is formed over the pre-cut circuit substrate W2. A material of the first dielectric sub-layer DM1 may include polybenzoxazole (PBO), polyimide (PI), benzocyclobutene (BCB), a photo-sensitive resin, but is not limited to the above-mentioned materials. For example, the first dielectric sub-layer DM1 is formed by spin-coating, dispensing, deposition, or other suitable technique(s). In some embodiments, the first dielectric sub-layer DM1 is conformally formed to cover the pre-diced isolation layer 240' and the TIVs 124 of the pre-cut circuit substrate W2. The sidewalls 240s' of the pre-diced isolation layer 240' and the sidewalls 222s' of the pre-diced substrate 222' are in physical contact with the first dielectric sub-layer DM1. For example, the groove GV is filled by the first dielectric sub-layer DM1.

Figure 4C:
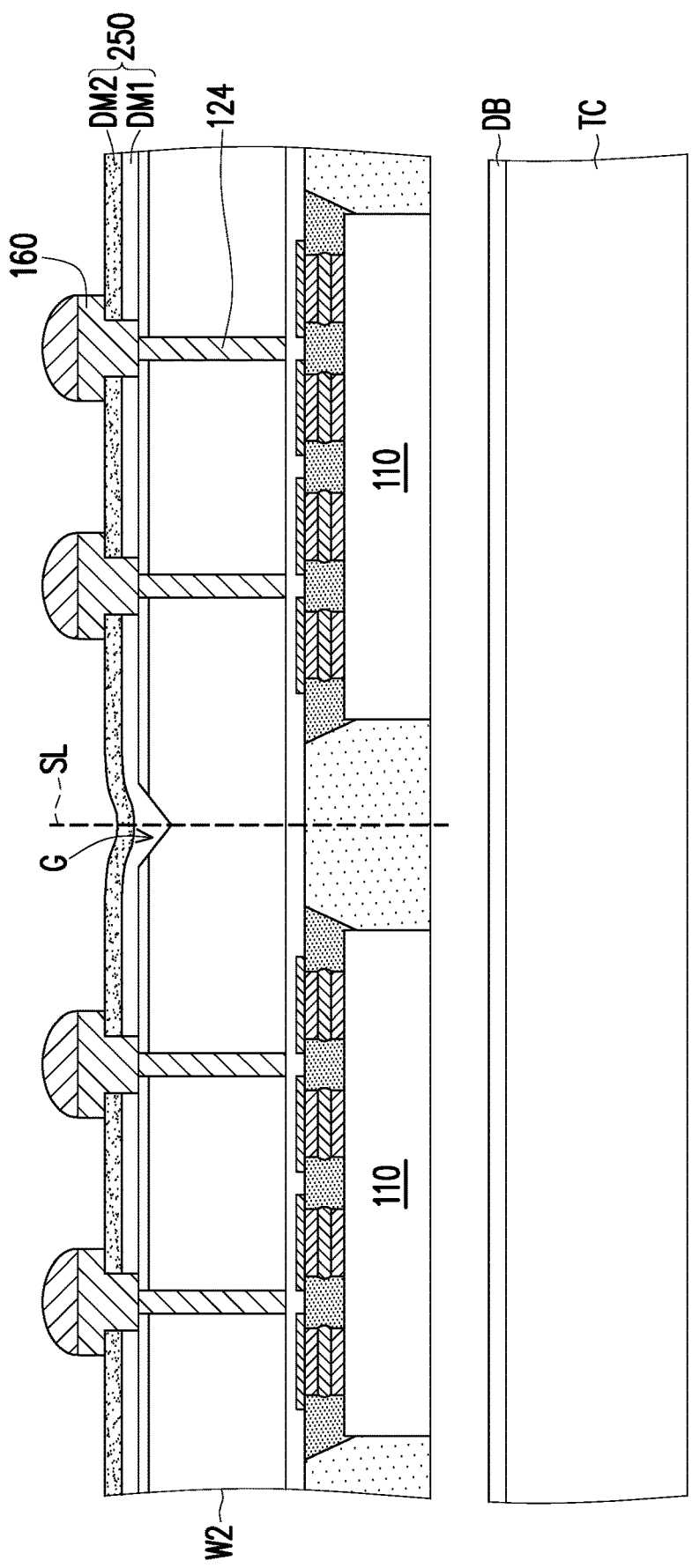

Referring to FIG. 4C, a second dielectric sub-layer DM2 may be formed on the first dielectric sub-layer DM1, and then patterned to form the patterned dielectric layer 250. In an exemplary embodiment, the first dielectric material is deposited and etched back to form the first dielectric sub-layer DM1 with openings (not shown) exposing the conductive vias 124 of the pre-cut circuit substrate W2. Next, the second dielectric material is deposited on the first dielectric sub-layer DM1 and fills the openings of the first dielectric sub-layer DM1, and then portions of the second dielectric sub-layer DM2 corresponding to the openings of the first dielectric sub-layer DM1 are removed to form the second dielectric sub-layer DM2 with openings (not shown). The openings of the first dielectric sub-layer DM1 and the second dielectric sub-layer DM2 may accessibly expose the conductive vias 124 of the pre-cut circuit substrate W2 for further electrical connection. In other embodiments, the first dielectric material and the second dielectric material are formed sequentially as blanket layers over the pre-cut circuit substrate W2, and then lithography and etching processes are performed to remove portions of the second dielectric material and the underlying first dielectric material together so as to accessibly expose the conductive vias 124 of the pre-cut circuit substrate W2 for further electrical connection.

In some embodiments, a region of the patterned dielectric layer 250 corresponding to the groove GV is slightly recessed relative to other region of the patterned dielectric layer 250 as shown in FIG. 4C. The material of the second dielectric sub-layer DM2 may be the same or different from that of the underlying first dielectric sub-layer DM1. For example, the second dielectric sub-layer DM2 is a polymer layer, including benzocyclobutene (BCB), polybenzoxazole (PBO), polyimide (PI), or a solder resist material layer, etc. In some embodiments, the second dielectric sub-layer DM2 has an electrical insulating material, such as a low-temperature polyimide, different from that of the first dielectric sub-layer DM1. Alternatively, one of the second dielectric sub-layer DM2 and the first dielectric sub-layer DM is omitted. It should be noted that the number of sub-layers illustrated in FIG. 4C merely serves as an illustrative example, more than two sub-layers or a single sub-layer may be employed as long as the patterned dielectric layer 250 may function as a buffer that reduces stress exerted on the pre-cut circuit substrate W2.

After forming the patterned dielectric layer 250, the conductive terminals 160 are formed on the patterned dielectric layer 250 and extend into the openings (not labeled) of the patterned dielectric layer 250 to be in physical and electrical contact with the conductive vias 124 of the pre-cut circuit substrate W2. The materials and the forming process of the conductive terminals 160 may be similar to those of the conductive terminals 160 described in FIG. 1G, so the detailed descriptions are omitted for brevity. Subsequently, the de-bonding process may be performed on the temporary carrier TC to remove the temporary carrier TC. The de-bonding process is similar to the process described in FIG. 1G, so the detailed descriptions are omitted for brevity.

Figure 4D:
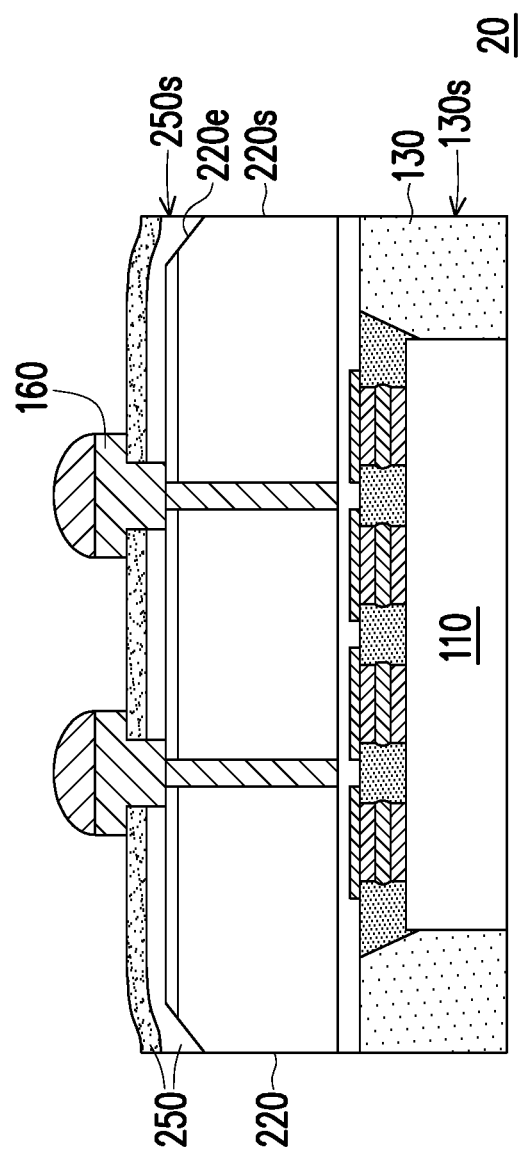

Referring to FIG. 4C and FIG. 4D, a singulation process may be performed to cut through the patterned dielectric layer 250, the pre-cut circuit substrate W2, and the insulating encapsulation 130 within the scribe line regions. For example, after removing the temporary carrier TC, the structure may be transferred to be placed on the dicing tape for singulation. The singulation process includes cutting the predetermined areas that the pre-cutting process previously cut to separate the predetermined areas into a plurality of semiconductor structures 20. The singulation process may provide a full cut passing through the pre-cut circuit substrate W2 to render a plurality of circuit carriers 220. For example, the dicing tool (not shown) cuts along the scribe lines SL, within the groove GV, so that a portion of the patterned dielectric layer 250 in the groove GV is remained on the circuit carrier 220. The circuit substrate is cut by two-step cutting process (i.e., the pre-cut and the singulation) so that the periphery of the circuit carrier 220 has a chamfered profile as shown in FIG. 4D.

In some embodiments, the groove GV, which is a bevel cut, is formed with a width greater than the width of a kerf created by the dicing tool, so that after singulation, the circuit carrier 220 of the semiconductor structure 20 includes the beveled edge 220e, and a substantially vertical singulated sidewall 220s connected to the beveled edge 220e. The beveled edge 220e is an edge that is not substantially perpendicular to the surfaces (e.g., second surface or sidewall of the substrate) connected thereto. In some embodiments, a singulated sidewall 250s of the patterned dielectric layer 250 disposed on the beveled edge 220e is substantially leveled with the singulated sidewall 220s of the circuit carrier 220 and the singulated sidewall 130s of the insulating encapsulation 130. Due to the existence of the beveled edge 220e of the circuit carrier 220 and the patterned dielectric layer 250 covering the beveled edge 220e, edge/corner cracking of the circuit carrier 220 may be eliminated and the reliability of the semiconductor structure 20 is improved.

Figure 5:
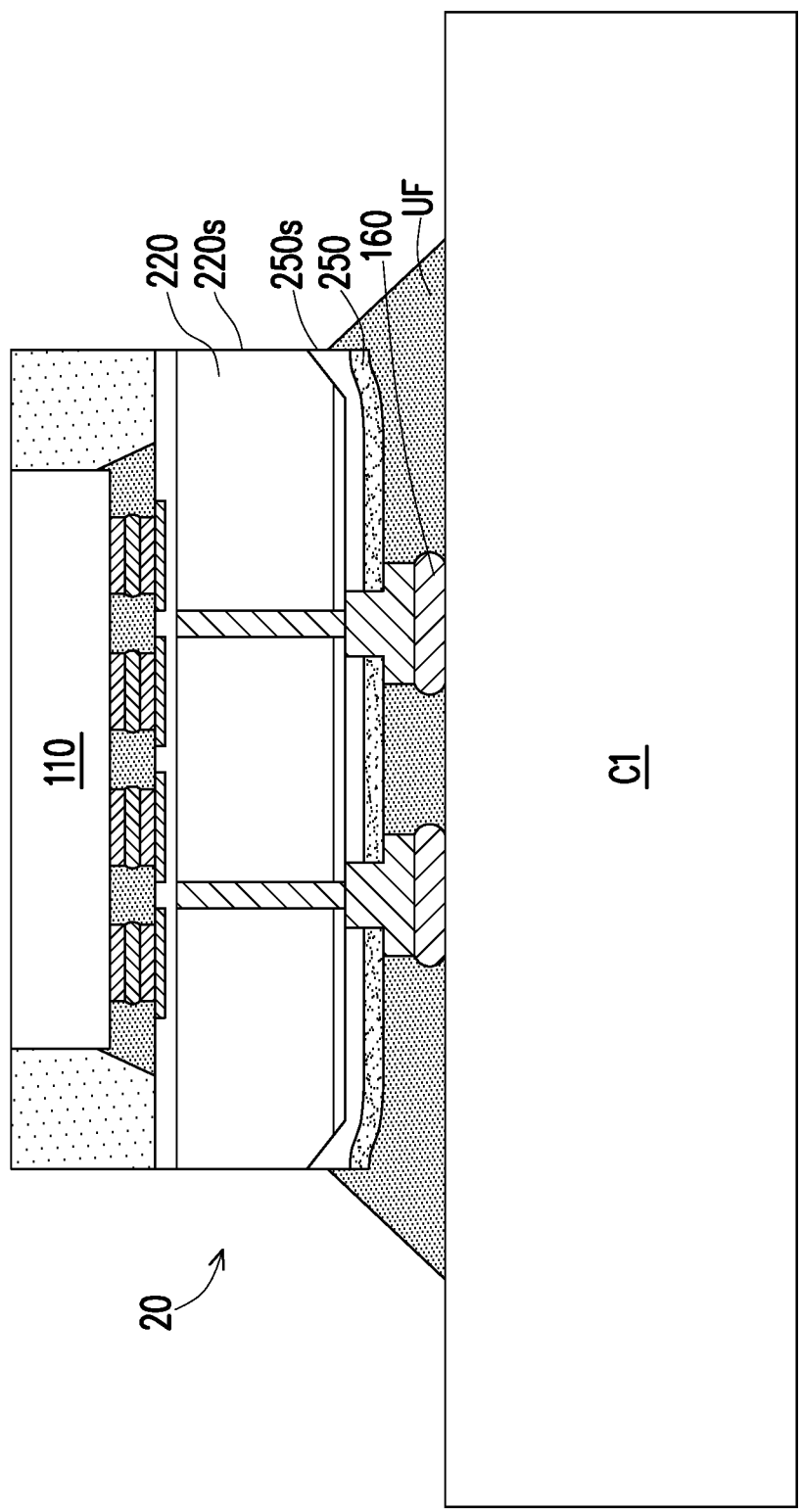
FIG. 5 is a schematic cross-sectional view illustrating an application of a semiconductor structure in accordance with some exemplary embodiments of the disclosure.

FIG. 5 is a schematic cross-sectional view illustrating an application of a semiconductor structure in accordance with some exemplary embodiments of the disclosure. Like elements are designated with the same reference numbers for ease of understanding and the details thereof are not repeated herein. Referring to FIG. 5, the semiconductor structure 20 is mounted on the external electric component C1 to form an electronic device ED2. The semiconductor structure 20 is in physical and electrical contact with the external electric component C1 through the conductive terminals 160, and the underfill layer UF is optionally formed between the external electric component C1 and the semiconductor structure 20 to provide adhesion and stress relief therebetween. The electronic device ED2 is similar to the electronic device ED1 described in FIG. 3, so the detailed descriptions are omitted for brevity. In some embodiments, a sufficient amount of the underfill layer UF is dispensed so that a portion of the underfill layer UF climbs upwardly to cover at least a portion of the singulated sidewall 250s of the patterned dielectric layer 250 or extend further to cover at least a portion of the singulated sidewall 220s of the circuit carrier 220 for protection.

Figure 6A:
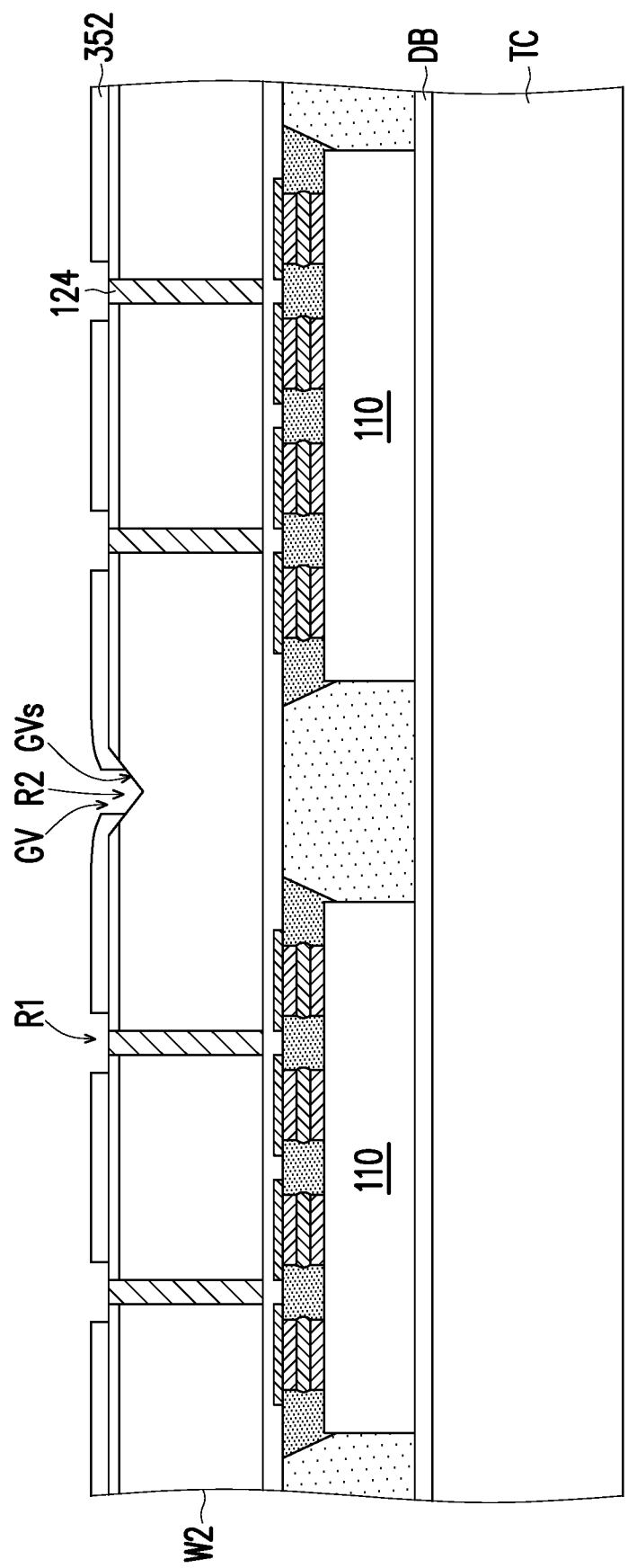
FIG. 6A to FIG. 6C are schematic cross-sectional views of various stages of manufacturing a semiconductor structure in accordance with some exemplary embodiments of the disclosure.
Figure 6B:
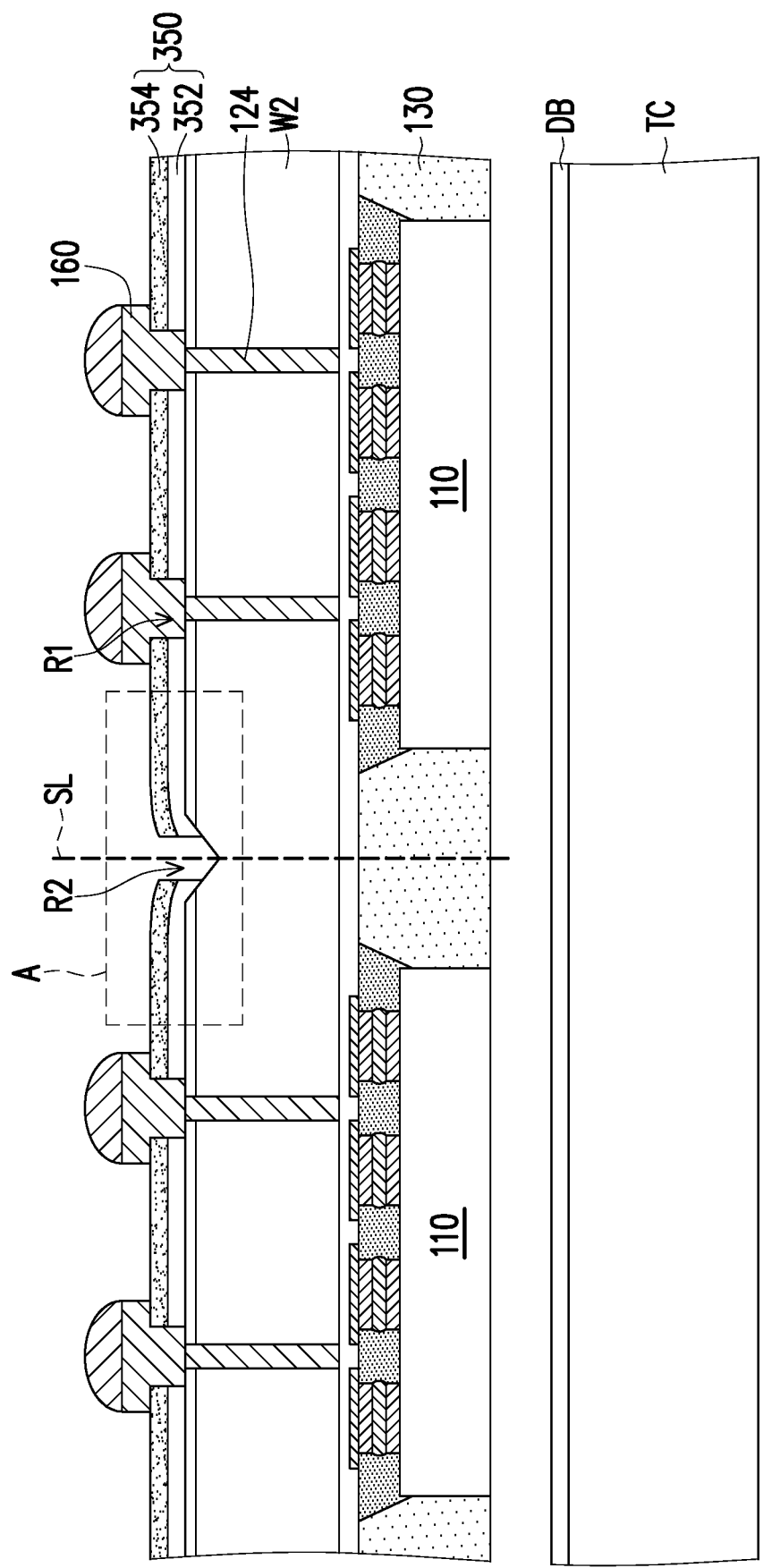
Figure 6C:
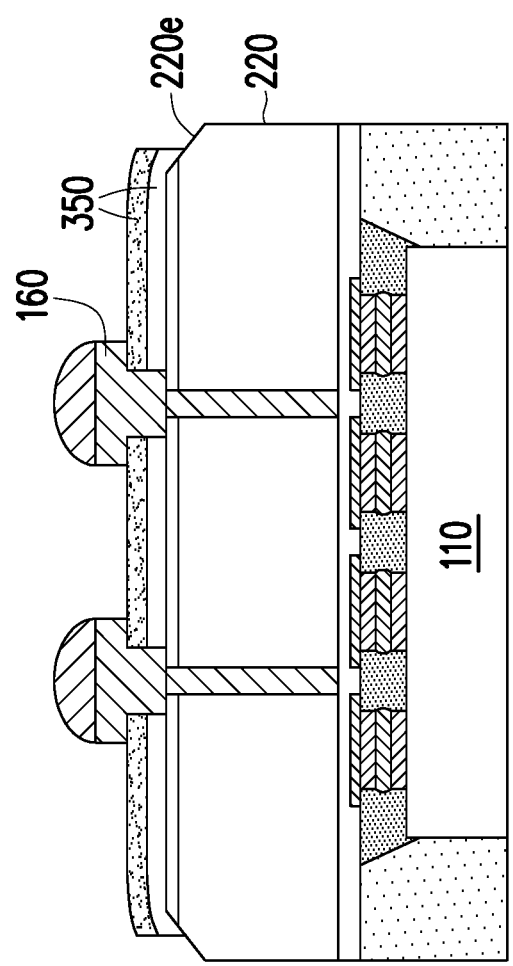

FIG. 6A to FIG. 6C are schematic cross-sectional views of various stages of manufacturing a semiconductor structure in accordance with some exemplary embodiments of the disclosure. The structure shown in FIG. 6A is fabricated by the processes similar to the processes described in FIG. 4A and FIG. 4B, for example, the pre-cutting process is performed on the circuit substrate to form the groove, and then the first dielectric sub-layer is formed over the circuit substrate and fills the groove. Like elements are designated with the same reference numbers for ease of understanding and the details thereof are not repeated herein. Referring to FIG. 6A, a portion of the first dielectric sub-layer is removed to form the first patterned sub-layer 352 with first recesses R1 and a second recess R2 by, for example, using lithography and etching processes or other suitable techniques.

The first recesses R1 of the first patterned sub-layer 352 may accessibly reveal at least a portion of the TIVs 124 for further electrical connection. The width (or diameter) of the first recess R1 may be wider than the width of the corresponding TIV 124. Alternatively, the width of the first recess R1 is narrower than the width of the corresponding TIV 124. In some embodiments, a portion of the first dielectric sub-layer formed in the groove GV is removed to form the second recess R2. The width of the groove GV may be greater than the width of the second recess R2. For example, the the bottoms of the slanted sidewalls GVs are accessibly exposed by the second recess R2, while the tops of the slanted sidewalls GVs are still covered by the first patterned sub-layer 352. It should be noted that the profiles of the first recesses R1 and the second recess R2 shown in FIG. 6A are merely serves as an illustrative example, the profiles of the first recesses R1 and the second recess R2 may be tapered or may have substantially vertical sidewalls, which depends on the employed formation techniques.

Referring to FIG. 6B, a second patterned sub-layer 354 is optionally formed on the first patterned sub-layer 352. The forming process and the material of the second patterned sub-layer 354 may be similar to those of the second dielectric sub-layer DM2 described in FIG. 4C, except that the second patterned sub-layer 354 further includes first recesses R1 and the second recess R2 respectively corresponding to the first recesses R1 and the second recess R2 of the first patterned sub-layer 352. The first patterned sub-layer 352 and the second patterned sub-layer 354 may be collectively viewed as the patterned dielectric layer 350.

In some embodiments, the first recesses R1 and the second recess R2 of the second patterned sub-layer 354 are respectively aligned with the underlying first recesses R1 and the second recess R2 of the first patterned sub-layer 354. For example, the width (or diameter) of the first recess R1 of the second patterned sub-layer 354 and/or the width of the second recess R2 of the second patterned sub-layer 354 are substantially aligned with the width of the first recess R1 of the underlying first patterned sub-layer 352 and/or the width of the second recess R2 of the underlying first patterned sub-layer 352. Alternatively, as will be described later in other embodiments, the width of the first recess of the first and second patterned sub-layers are not aligned and/or the width of the second recess of the first and second patterned sub-layers are not aligned. In other embodiments, the recesses of the second patterned sub-layer 354 and the first patterned sub-layer 352 are formed during the same damascene process. It should be noted that the number of sub-layers illustrated in FIG. 6B merely serves as an illustrative example, and the patterned dielectric layer 350 may include more than two sub-layers or a single sub-layer which depends on the design requirements.

Continue to FIG. 6B, after forming the patterned dielectric layer 350, the conductive terminals 160 are formed on the patterned dielectric layer 350 and embedded in the patterned dielectric layer 350 to be in physical and electrical contact with the underlying TIVs 124. For example, the bottoms of the conductive terminals 160 formed in the first recesses R1 of the first patterned sub-layer 352 and the second patterned sub-layer 354. The forming process and the material of the conductive terminals 160 may be similar to those of the conductive terminals 160 described in FIG. 1G, so the detailed descriptions are omitted for brevity. After forming the conductive terminals 160, the second recess R2 may remain unmasked so that the bottoms of the groove GV are not covered. Subsequently, the de-bonding process may be performed on the temporary carrier TC to release from the insulating encapsulation 130. The de-bonding process is similar to the process described in FIG. 1G, so the detailed descriptions are omitted for brevity.

Referring to FIG. 6B and FIG. 6C, a singulation process may be performed to cut through the pre-cut circuit substrate W2 and the underlying insulating encapsulation 130 within the scribe line regions. The singulation process includes cutting the predetermined areas that the pre-cutting process previously cut to separate the predetermined areas into a plurality of semiconductor structures 30. The singulation process may provide a full cut penetrating through the pre-cut circuit substrate W2 to render a plurality of circuit carriers 220. For example, the dicing tool cuts along the scribe lines SL, within the second recess R2, so that the dicing tool cuts the pre-cut circuit substrate W2 and the underlying insulating encapsulation 130 without dicing the patterned dielectric layer 350, so that the patterned dielectric layer 350 partially covers the beveled edge 220e of the circuit carrier 220 for protection, as shown in FIG. 6C. In other embodiments, the sidewalls of the patterned dielectric layer 350 in the scribe line region are slightly cut, but at least a portion of the patterned dielectric layer 350 remains partially covering the beveled edge 220e of the circuit carrier 220 for protection. It should be noted that the coverage of the patterned dielectric layer 350 to the beveled edge 220e of the circuit carrier 220 construes no limitation in the disclosure as long as the patterned dielectric layer 350 may function as a buffer during the subsequent mounting or testing process.

Figure 7:
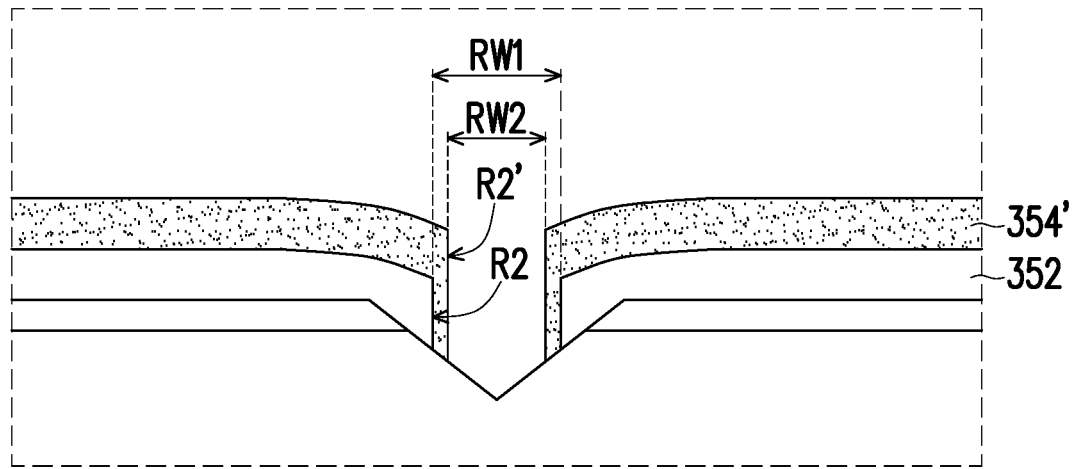
FIG. 7 and FIG. 8 are schematic cross-sectional views illustrating different variations in a dashed box A outlined in FIG. 6B in accordance with some exemplary embodiments of the disclosure.
Figure 8:
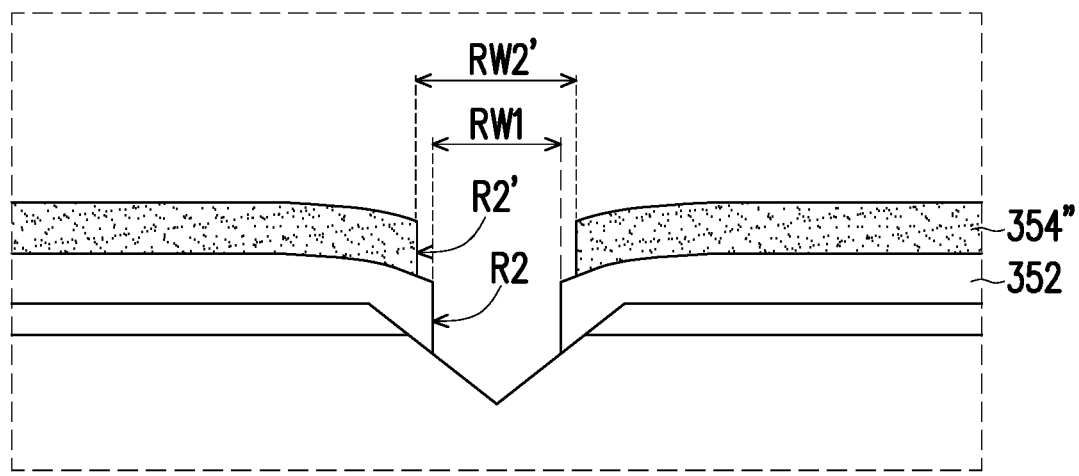

FIG. 7 and FIG. 8 are schematic cross-sectional views illustrating different variations in a dashed box A outlined in FIG. 6B in accordance with some exemplary embodiments of the disclosure. Referring to FIG. 7 and FIG. 8, the width RW2' of the second recess R2' of the second patterned sub-layer 354' is less than the width RW1 of the second recess R2 of the first patterned sub-layer 352. In some embodiments, the second patterned sub-layer 354' covers the inner sidewalls of the first patterned sub-layer 352 defining the second recess R2. As shown in FIG. 8, the width RW2' of the second recess R2' of the second patterned sub-layer 354'' is greater than the width RW1 of the second recess R2 of the first patterned sub-layer 352, so that at least a portion of the first patterned sub-layer 352 may be exposed by the overlying second patterned sub-layer 354''.

It should be noted that the first recess of the first patterned sub-layer and the second patterned sub-layer may have the same or similar configuration(s) as illustrated in FIG. 7 and FIG. 8. The misalignment of the recess of the second patterned sub-layer and the recess of the first patterned sub-layer may result from the overlay error caused by variations in lithography and etching processes or other factors. The overlay error may be within the process variation window, and may not cause reliability issues for the semiconductor structure.

Figure 9A:
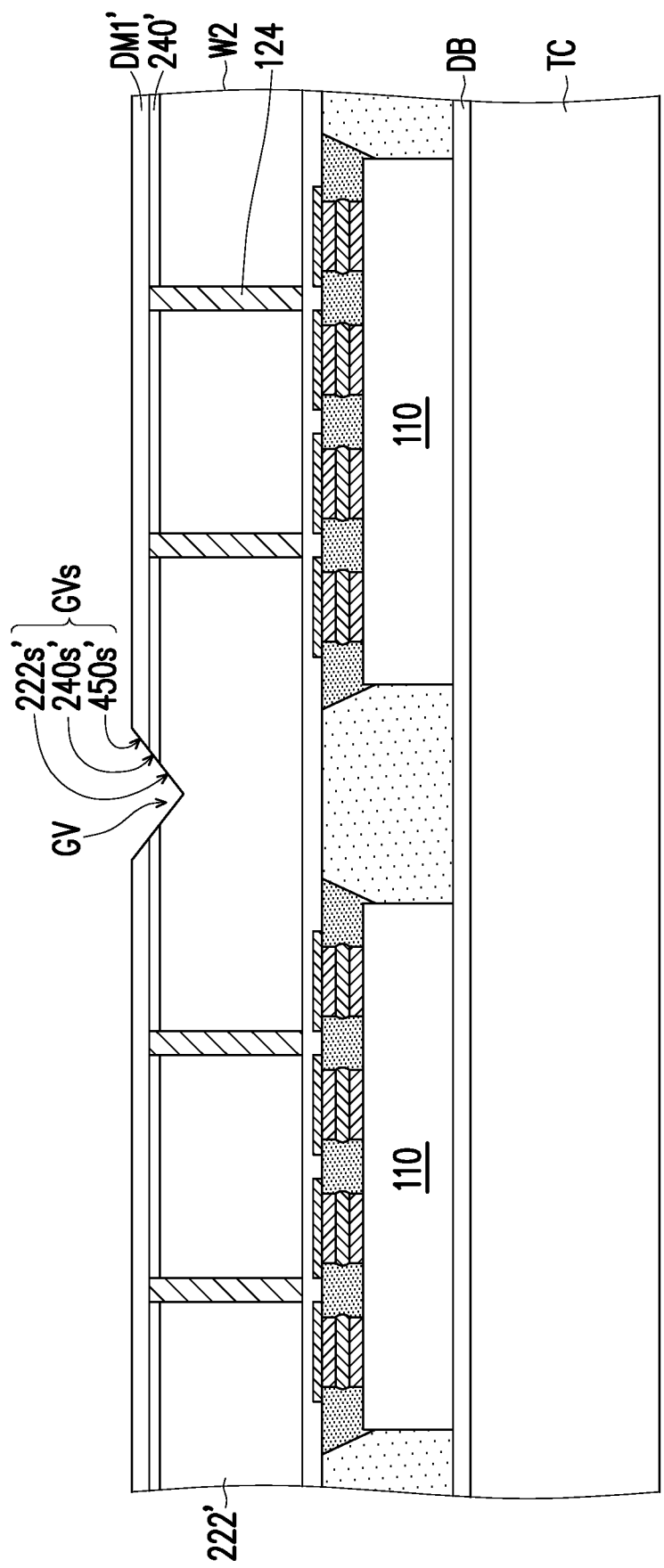
FIG. 9A to FIG. 9C are schematic cross-sectional views of various stages of manufacturing a semiconductor structure in accordance with some exemplary embodiments of the disclosure.
Figure 9B:
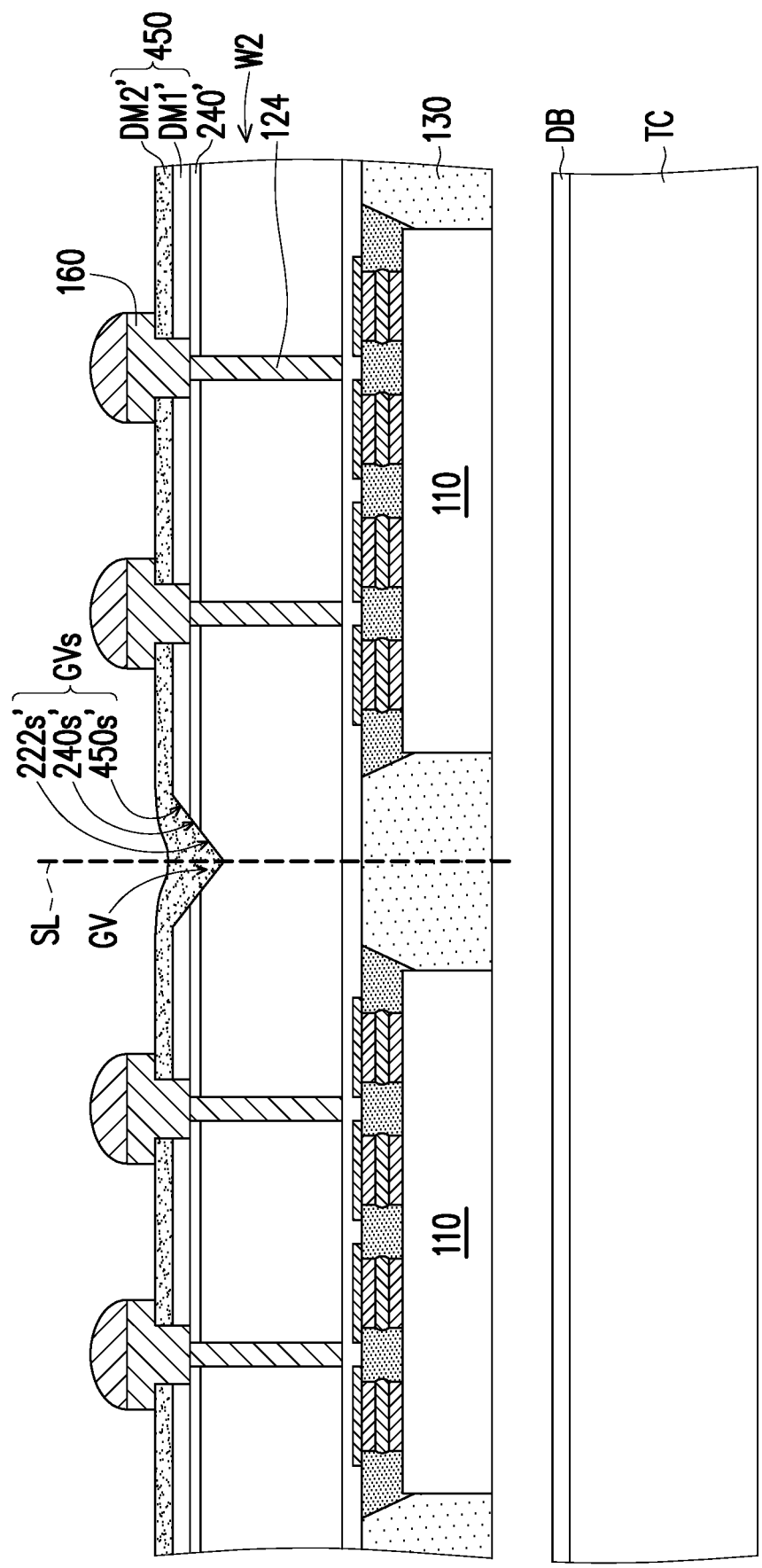
Figure 9C:
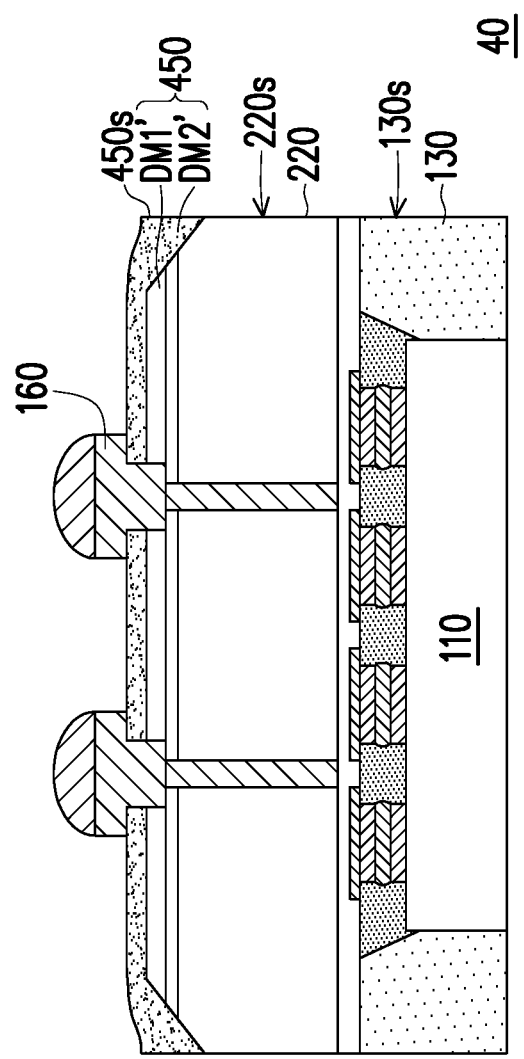

FIG. 9A to FIG. 9C are schematic cross-sectional views of various stages of manufacturing a semiconductor structure in accordance with some exemplary embodiments of the disclosure. Like elements are designated with the same reference numbers for ease of understanding and the details thereof are not repeated herein. Referring to FIG. 9A, a first dielectric material is formed over the circuit substrate W1 (shown in FIG. 1D). For example, the first dielectric material is deposited on the isolation layer 140 and covers the TIVs 124. Next, a pre-cutting process is performed on the first dielectric material and the underlying circuit substrate W1 to form the pre-cut dielectric layer DM1' and the pre-cut circuit substrate W2. The pre-cutting process is to partially remove the first dielectric material and the underlying circuit substrate W1 so as to render the groove GV on the structure as shown in FIG. 9A.

Since a portion of the circuit substrate W1 is removed along with a portion of the overlying first dielectric material during the pre-cutting process, the sidewalls 450s' of the pre-cut dielectric layer DM1', the sidewalls 240s' of the pre-diced isolation layer 240', and the sidewalls 222s' of the pre-diced substrate 222' are continuously formed as sidewalls GVs of the groove GV. The shape of the groove GV may be defined by the shape of the dicing tool or the formation techniques as mentioned above, the profile of the groove illustrated in FIG. 9A merely serves as an illustrative example, the profile of the groove GV construe no limitation in the disclosure.

Referring to FIG. 9B, after performing the pre-cutting process, a second dielectric material DM2' is optionally formed on the pre-cut dielectric layer DM1' and fills the groove GV. In some embodiments, a region of the second dielectric material DM2' corresponding to the groove GV is slightly recessed relative to other region of the second dielectric material DM2'. A portion of the second dielectric material DM2' formed in the groove GV may be in physical contact with the sidewalls 450s' of the pre-cut dielectric layer DM1', the sidewalls 240s' of the pre-diced isolation layer 240', and the sidewalls 222s' of the pre-diced substrate 222'. Next, portions of the second dielectric material DM2' and the underlying pre-cut dielectric layer DM1' at the predetermined locations may be removed by, for example, using lithography and etching processes or other suitable techniques, to form the patterned dielectric layer 450 with the openings. The openings of the patterned dielectric layer 450 may accessibly reveal at least a portion of the underlying TIVs 124 for further electrical connection.

Subsequently, the conductive terminals 160 are formed on the patterned dielectric layer 450 and fill in the openings of the patterned dielectric layer 450 to be in physical and electrical contact with the TIVs 124. The materials and the forming process of the conductive terminals 160 may be similar to those of the conductive terminals 160 described in FIG. 1G, so the detailed descriptions are omitted for brevity. Subsequently, a de-bonding process may be performed on the temporary carrier TC to release from the insulating encapsulation 130. The de-bonding process is similar to the process described in FIG. 1G, so the detailed descriptions are omitted for brevity.

Referring to FIG. 9B and FIG. 9C, a singulation process may be performed to cut through the patterned dielectric layer 450, the pre-cut circuit substrate W2, and the insulating encapsulation 130. For example, after removing the temporary carrier TC, the structure may be transferred to be placed on the dicing tape for singulation. The singulation process includes cutting the predetermined areas that the pre-cutting process previously cut to separate the predetermined areas into a plurality of semiconductor structures 40. The singulation process may provide a full cut passing through the pre-cut circuit substrate W2 to render the circuit carriers 220. For example, the dicing tool cuts along the scribe lines SL, within the groove GV, so that a portion of the patterned dielectric layer 450 in the groove GV is remained on the circuit carrier 220.

In some embodiments, after singulation, a singulated sidewall 450s of the second dielectric material DM2' is substantially leveled with the singulated sidewall 220s of the circuit carrier 220 and the singulated sidewall 130s of the insulating encapsulation 130. In some embodiments, the semiconductor structure 40 includes the second dielectric material DM2' of the patterned dielectric layer 450 encapsulating the pre-cut dielectric layer DM1' and extending to cover the beveled edge 220e of the circuit carrier 220. Due to the existence of the beveled edge 220e of the circuit carrier 220 and the patterned dielectric layer 450 covering the beveled edge 220e, edge/corner cracking of the circuit carrier 220 may be eliminated and the reliability of the semiconductor structure 40 is improved.

Figure 10A:
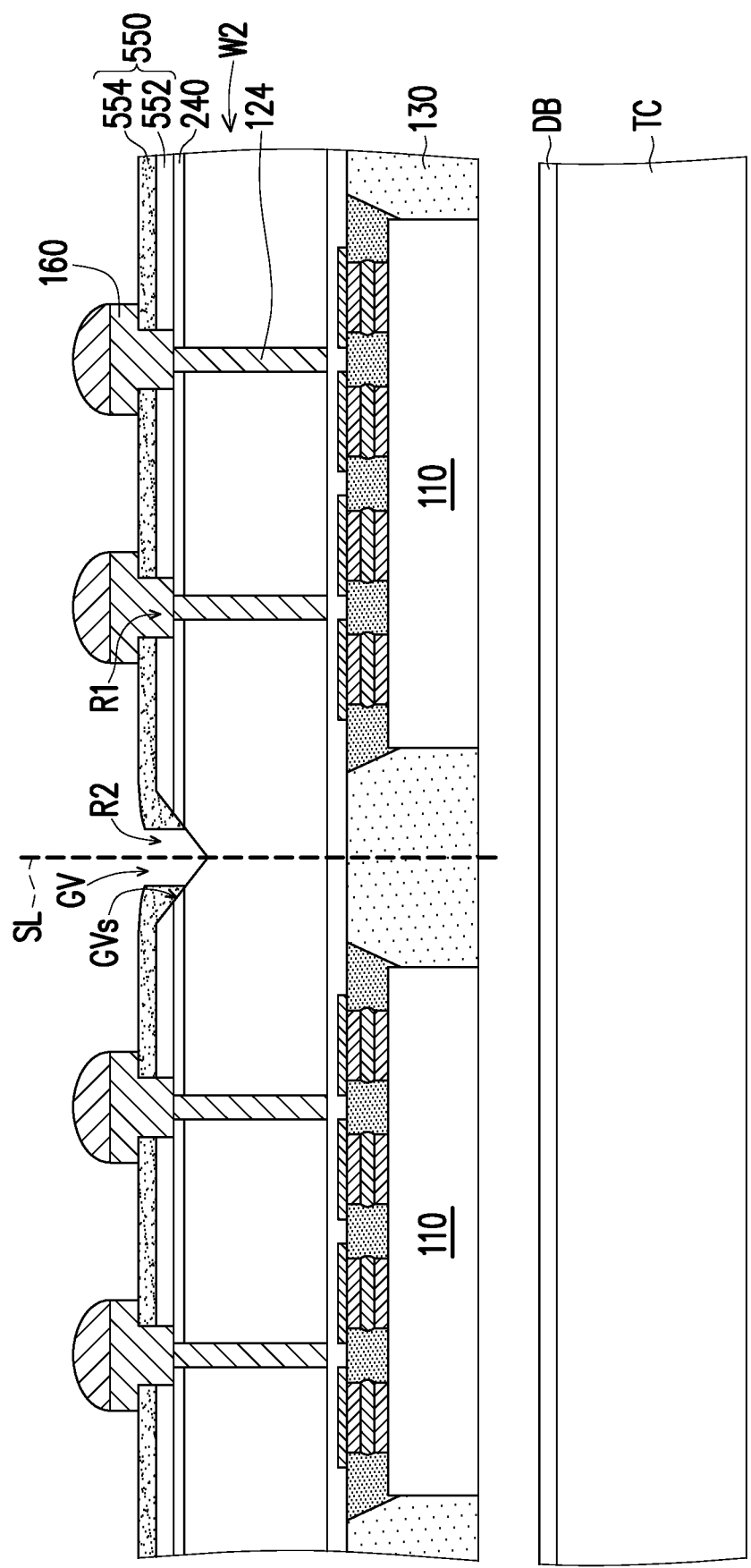
FIG. 10A and FIG. 10B are schematic cross-sectional views of various stages of manufacturing a semiconductor structure in accordance with some exemplary embodiments of the disclosure.
Figure 10B:
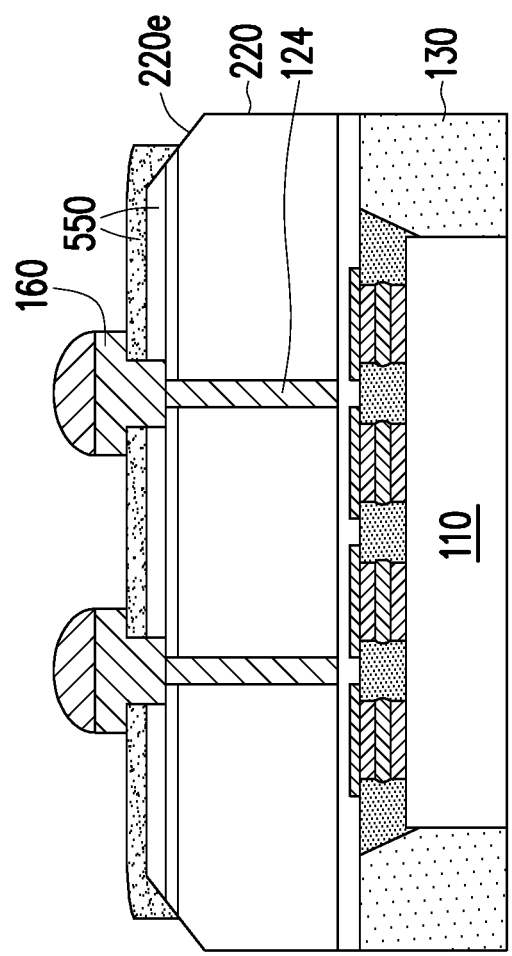

FIG. 10A and FIG. 10B are schematic cross-sectional views of various stages of manufacturing a semiconductor structure in accordance with some exemplary embodiments of the disclosure. The structure shown in FIG. 10A is fabricated by the processes similar to the processes described in FIG. 9A and FIG. 9B, for example, the pre-cutting process is performed on the first dielectric material and the underlying circuit substrate to form the pre-cut dielectric layer and the pre-cut circuit substrate, and then the second dielectric material is formed on the pre-cut dielectric layer. Like elements are designated with the same reference numbers for ease of understanding and the details thereof are not repeated herein. Referring to FIG. 10A, portions of the second dielectric material and the underlying pre-cut dielectric layer at the predetermined locations may be removed by, for example, lithography and etching processes or other suitable techniques, to respectively form the first patterned sub-layer 552 and the second patterned sub-layer 554. The first patterned sub-layer 552 and the second patterned sub-layer 554 may be collectively viewed as the patterned dielectric layer 550.

The patterned dielectric layer 550 may include the first recesses R1 accessibly revealing the underlying TIVs 124, and the second recess R2 partially exposing the sidewall GVs of the groove GV. The first recesses R1 and the second recess R2 are similar to the first recesses R1 and the second recess R2 described in FIG. 6A and FIG. 6B, so the detailed descriptions are omitted for brevity. After forming the patterned dielectric layer 550, the conductive terminals 160 are formed on the patterned dielectric layer 550 and fill the first recesses R1 of the patterned dielectric layer 550 to be in physical and electrical contact with the TIVs 124. The materials and the forming process of the conductive terminals 160 may be similar to those of the conductive terminals 160 described in FIG. 1G, so the detailed descriptions are omitted for brevity. Subsequently, the de-bonding process may be performed on the temporary carrier TC to release the temporary carrier TC from the insulating encapsulation 130. The de-bonding process may be similar to the process described in FIG. 1G, so the detailed descriptions are omitted for brevity.

Referring to FIG. 10A and FIG. 10B, a singulation process may be performed to cut through the pre-cut circuit substrate W2 and the underlying insulating encapsulation 130. The singulation process includes cutting the predetermined areas that the pre-cutting process previously cut to separate the predetermined areas into a plurality of semiconductor structures 50. The singulation process may provide a full cut passing through the pre-cut circuit substrate W2 to render the circuit carriers 220. For example, the dicing tool cuts along the scribe lines SL, within the second recess R2, so that the dicing tool cuts the pre-cut circuit substrate W2 and the underlying insulating encapsulation 130 without dicing the patterned dielectric layer 550. After dicing, a portion of the patterned dielectric layer 550 is remained partially covering the beveled edge 220e of the circuit carrier 220 for protection, as shown in FIG. 6C. In other embodiments, the sidewalls of the patterned dielectric layer 550 in the scribe line region are slightly cut, but the patterned dielectric layer 550 remains partially covering the beveled edge 220e of the circuit carrier 220 for protection. It should be noted that the coverage of the patterned dielectric layer 550 to the beveled edge 220e of the circuit carrier 220 construe no limitation in the disclosure as long as the patterned dielectric layer 550 may serve as a buffer during the subsequent mounting or testing process.

Figure 11:
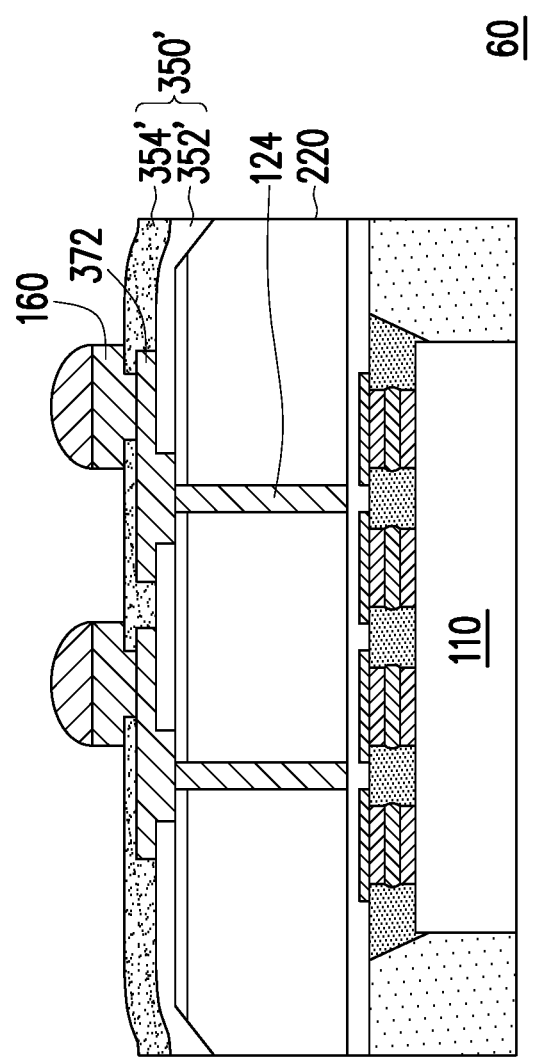
FIG. 11 is a schematic cross-sectional view illustrating a semiconductor structure in accordance with some exemplary embodiments of the disclosure.

FIG. 11 is a schematic cross-sectional view illustrating a semiconductor structure in accordance with some exemplary embodiments of the disclosure. Referring to FIG. 11, a semiconductor structure 60 is provided. The semiconductor structure 60 is similar to the semiconductor structure 20 described in FIG. 4D, and like elements are designated with the same reference numbers for ease of understanding and the details thereof are not repeated herein. The difference between the semiconductor structures 20 and 60 lies in that the semiconductor structure 60 further includes a redistribution circuitry 372.

For example, after forming the first dielectric sub-layer DM1 as described in FIG. 4B, a portion of the first dielectric sub-layer DM1 is removed to form a first patterned sub-layer 352' with openings (not labeled) by, for example, using lithography and etching processes or other suitable techniques. The openings of the first patterned sub-layer 352' may accessibly reveal at least a portion of the underlying TIVs 124. In some embodiments, the width (or diameter) of the opening may be wider than the width of the corresponding TIV 124. Alternatively, the width of the opening of the first patterned sub-layer 352' is narrower than the width of the corresponding TIV 124. Next, a redistribution circuitry 372 is formed on the first patterned sub-layer 352' and in the openings of the first patterned sub-layer 352' to be in physical and electrical contact with the TIVs 124. In an exemplary embodiment, the redistribution circuitry 372 is formed by using patterning and metallization techniques to form conductive vias, conductive pads, conductive lines, or the like. The redistribution circuitry 372 may be formed to remap a layout for the circuit carrier 220. Next, the second patterned sub-layer 254 may be formed on the first patterned sub-layer 352' to partially cover the redistribution circuitry 372. For example, the second patterned sub-layer 254 includes openings (not labeled) accessibly exposing at least a portion of the underlying redistribution circuitry 372 for further electrical connection.

Subsequently, the conductive terminals 160 are formed on the second patterned sub-layer 254 and in the openings of the second patterned sub-layer 254 to be in physical and electrical contact with the redistribution circuitry 372. The forming process of the conductive terminals 160 may be similar to the process described in FIG. 1G, so the detailed descriptions are omitted for brevity. In some embodiments, the redistribution circuitry 372 and the patterned dielectric layer 350' including first and second patterned dielectric sub-layers 352' and 354' are collectively referred to as a redistribution layer (RDL). The redistribution circuitry 372 forms connections, which may run horizontally and map the conductive terminals 160 to different TIVs 124, to provide flexibility in the formation of conductive terminals 160. In some embodiments, forming the redistribution circuitry 372 between the circuit carrier 220 and the conductive terminals 160 allows the layout of the circuit carrier 220 to expand wider than the given area, so that the occurrence of undesired bridging issues due to the finer pitch between adjacent conductive terminals may be prevented. It should be noted that combination schemes of the redistribution layer may be formed to include different types of semiconductor structure discussed herein, so that variations thereof may be carried out while still remaining within the scope of the claims and disclosure.

According to some embodiments, a semiconductor structure includes a circuit carrier, a dielectric layer, a conductive terminal, a semiconductor die, and an insulating encapsulation. The circuit carrier includes a first surface, a second surface opposite to the first surface, a sidewall connected to the first surface and the second surface, and an edge between the second surface and the sidewall. The dielectric layer is disposed on the second surface of the circuit carrier and extends to at least cover the edge of the circuit carrier. The conductive terminal is disposed on the dielectric layer and partially embedded in the dielectric layer to be in contact with the circuit carrier. The semiconductor die is disposed on the first surface of the circuit carrier, and the semiconductor die is electrically coupled to the conductive terminal through the circuit carrier. The insulating encapsulation is disposed on the first surface of the circuit carrier and encapsulates the semiconductor die.

According to some alternative embodiments, a manufacturing method of a semiconductor structure includes at least the following steps. An encapsulated semiconductor die is disposed on a first surface of a circuit carrier to be in electrical contact with the circuit carrier. A second surface of the circuit carrier and an edge of the circuit carrier is protected with a patterned dielectric layer, where the second surface of the circuit carrier is opposite to the first surface, and the edge of the circuit carrier is connected to the second surface. A conductive terminal is formed penetrating through the patterned dielectric layer to be in electrical contact with the circuit carrier.

According to some alternative embodiments, a manufacturing method of a semiconductor structure includes at least the following steps. A plurality of semiconductor dies on a circuit substrate is encapsulated with an insulating encapsulation. The circuit substrate is cut to form a plurality of circuit carriers with diced sidewalls. A patterned dielectric layer is formed on the circuit carriers opposite to the insulating encapsulation, where a portion of the patterned dielectric layer extends to cover the diced sidewalls of the circuit carriers. A plurality of conductive terminals s formed on the patterned dielectric layer to be electrically coupled to the semiconductor dies through the circuit carriers. A singulation process is performed to at least cut through the insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
  a circuit carrier comprising a first surface, a second surface opposite to the first surface, a sidewall connected to the first surface and the second surface, and an edge between the second surface and the sidewall;
  a dielectric layer disposed on the second surface of the circuit carrier and extending to at least cover the edge of the circuit carrier;
  a conductive terminal disposed on the dielectric layer and partially embedded in the dielectric layer to be in contact with the circuit carrier;
  a semiconductor die disposed on the first surface of the circuit carrier, the semiconductor die being electrically coupled to the conductive terminal through the circuit carrier; and
  an insulating encapsulation disposed on the first surface of the circuit carrier and encapsulating the semiconductor die.

2. The semiconductor structure of claim 1, further comprising:
  an isolation layer disposed between the dielectric layer and the second surface of the circuit carrier, wherein a material of the isolation layer is different from that of the dielectric layer.

3. The semiconductor structure of claim 1, wherein the dielectric layer extends beyond the edge of the circuit carrier and along the sidewall of the circuit carrier to be in contact with the insulating encapsulation.

4. The semiconductor structure of claim 3, wherein an interface between the dielectric layer and the insulating encapsulation is located between the first surface of the circuit carrier and a surface of the insulating encapsulation opposite to the first surface of the circuit carrier.

5. The semiconductor structure of claim 1, wherein the edge of the circuit carrier is a bevel cut, the dielectric layer extends beyond the second surface of the circuit carrier to partially cover the bevel cut.

6. The semiconductor structure of claim 1, wherein the edge of the circuit carrier is a bevel cut, the dielectric layer extends to cover the edge of the circuit carrier, and a sidewall of the dielectric layer is substantially leveled with the sidewall of the circuit carrier.

7. The semiconductor structure of claim 1, further comprising:
  a redistribution circuitry disposed between circuit carrier and the conductive terminal and embedded in the dielectric layer, wherein the conductive terminal is electrically coupled to the circuit carrier through the redistribution layer.

8. A semiconductor structure, comprising:
  a semiconductor die encapsulated by an insulating encapsulation;
  a circuit carrier comprising a first surface, a second surface opposite to the first surface, and a sidewall connected to the first surface and the second surface, and the first surface being connected to the semiconductor die and the insulating encapsulation;
  a dielectric layer disposed over the second surface of the circuit carrier, extending along the sidewall of the circuit carrier, and being in contact with the insulating encapsulation; and
  a conductive terminal disposed on and passing through the dielectric layer to be electrically coupled to the semiconductor die through the circuit carrier.

9. The semiconductor structure of claim 8, further comprising:
  an isolation layer interposed between the dielectric layer and the second surface of the circuit carrier, wherein a material of the isolation layer is different from that of the dielectric layer.

10. The semiconductor structure of claim 8, wherein:
  the sidewall of the circuit carrier comprises a slanted segment connected to the second surface and a vertical segment connected to the first surface, and
  the dielectric layer extends beyond the slanted segment of the circuit carrier and along the vertical segment of the circuit carrier to be physically connected to the insulating encapsulation.

11. The semiconductor structure of claim 8, wherein the dielectric layer extends beyond the sidewall of the circuit carrier to be physically connected to the insulating encapsulation.

12. The semiconductor structure of claim 8, wherein the sidewall of the circuit carrier is slanted, and a surface area of the first surface of the circuit carrier is greater than that of the second surface of the circuit carrier.

13. The semiconductor structure of claim 8, wherein an outer sidewall of the dielectric layer is substantially leveled with an outer sidewall the insulating encapsulation.

14. The semiconductor structure of claim 8, further comprising:
- a circuit board, the conductive terminal being disposed on and electrically connected to the circuit board; and
- an underfill layer disposed between the dielectric layer and the circuit board to cover the conductive terminal.

15. A semiconductor structure, comprising:
- a semiconductor die encapsulated by an insulating encapsulation;
- a circuit carrier comprising a first surface, a second surface opposite to the first surface, and a bevel surface connected to the second surface, and the first surface being connected to the semiconductor die and the insulating encapsulation;
- a dielectric layer disposed over the second surface of the circuit carrier and extend toward the bevel surface of the circuit carrier; and
- a conductive terminal disposed on and passing through the dielectric layer to be electrically coupled to the semiconductor die through the circuit carrier.

16. The semiconductor structure of claim 15, wherein an outer sidewall of the dielectric layer is substantially leveled with an outer sidewall the circuit carrier and an outer sidewall the insulating encapsulation, and the outer sidewall the circuit carrier is connected to the bevel surface and the first surface.

17. The semiconductor structure of claim 15, wherein the dielectric layer comprises:
- a first sub-layer disposed on the second surface of the circuit carrier and covering a portion of the bevel surface of the circuit carrier; and
- a second sub-layer disposed on the first sub-layer and extending along a sidewall of the first sub-layer to cover another portion of the bevel surface of the circuit carrier.

18. The semiconductor structure of claim 15, wherein the dielectric layer comprises:
- a first sub-layer disposed on the second surface of the circuit carrier and covering a portion of the bevel surface of the circuit carrier; and
- a second sub-layer disposed on the first sub-layer, wherein the first sub-layer comprises a sidewall and a peripheral surface connected to the sidewall, and the sidewall and the peripheral surface of the first sub-layer are accessibly exposed by the second sub-layer.

19. The semiconductor structure of claim 15, wherein the dielectric layer comprises:
- a first sub-layer disposed on the second surface of the circuit carrier and comprising a slanted sidewall aligned with the bevel surface of the circuit carrier; and
- a second sub-layer disposed on the first sub-layer and at least covering the slanted sidewall of the first sub-layer.

20. The semiconductor structure of claim 15, wherein the dielectric layer comprises:
- a first sub-layer disposed on the second surface of the circuit carrier and covering the bevel surface of the circuit carrier; and
- a second sub-layer disposed on the first sub-layer, wherein outer sidewalls of the first sub-layer and the second sub-layer are substantially leveled with an outer sidewall the circuit carrier and an outer sidewall the insulating encapsulation, and the outer sidewall the circuit carrier is connected to the bevel surface and the first surface.

* * * * *